(12) United States Patent
Ren et al.

(10) Patent No.: US 7,588,839 B2
(45) Date of Patent: Sep. 15, 2009

(54) ELECTROLUMINESCENT DEVICE

(75) Inventors: Xiaofan Ren, Rochester, NY (US); Christopher T. Brown, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 623 days.

(21) Appl. No.: 11/254,108

(22) Filed: Oct. 19, 2005

(65) Prior Publication Data

US 2007/0087219 A1    Apr. 19, 2007

(51) Int. Cl.
*H01L 51/54* (2006.01)
*C09K 11/02* (2006.01)
*C07F 7/08* (2006.01)

(52) U.S. Cl. ............... 428/690; 428/917; 313/504; 313/506; 257/E51.046; 556/402; 556/404

(58) Field of Classification Search ......... 428/690, 428/917; 313/504, 506; 257/40, E51.044, 257/E51.046; 556/402, 418, 419, 413, 436, 556/489, 404; 562/899
See application file for complete search history.

(56) References Cited

U.S. PATENT DOCUMENTS

| | | | |
|---|---|---|---|
| 6,310,231 B1 | 10/2001 | Igarashi et al. | |
| 2002/0086180 A1* | 7/2002 | Seo et al. | 428/690 |
| 2003/0072965 A1* | 4/2003 | Kimura | 428/690 |
| 2003/0144487 A1 | 7/2003 | Grushin et al. | |
| 2003/0157366 A1 | 8/2003 | Matsuura et al. | |
| 2003/0205696 A1 | 11/2003 | Thoms et al. | |
| 2004/0101711 A1 | 5/2004 | Chen | |
| 2004/0209115 A1 | 10/2004 | Thompson et al. | |
| 2004/0209116 A1 | 10/2004 | Ren et al. | |
| 2005/0064238 A1 | 3/2005 | Lee et al. | |

FOREIGN PATENT DOCUMENTS

| | | |
|---|---|---|
| JP | 2004-95221 | 3/2004 |
| WO | 01/93642 | 12/2001 |
| WO | WO 2005/003253 A2 * | 1/2005 |

OTHER PUBLICATIONS

R. J. Holmes, et al., "Efficient, deep-blue organic electrophosphorescence by guest charge trapping", Applied Physics Letters, vol. 83, Nov. 1, 2003, pp. 3818-3820.
S. Yeh, et al., "New Dopant and Host Materials for Blue-Light-Emitting Phosphorescent Organic Electroluminescent Devices", Advanced Materials, 2005, 17, No. 3, pp. 285-289.

* cited by examiner

*Primary Examiner*—D. Lawrence Tarazano
*Assistant Examiner*—Michael Wilson
(74) *Attorney, Agent, or Firm*—Arthur E. Kluegel; Raymond L. Owens

(57) ABSTRACT

An OLED device comprises a cathode and an anode and has located therebetween a light-emitting layer comprising a phosphorescent light-emitting material and a host comprising a compound of a tetravalent atom wherein the four groups bonded to the atom are aromatic rings, at least one of which contains an electron-withdrawing group (EWG) substituent comprising at least three atoms, the compound having a triplet energy of at least 2.7 eV and a LUMO energy within 0.6 eV of the LUMO energy of at least one material in an adjacent layer on the cathode side of the light-emitting layer. Particular embodiments include certain tetravalent silicon compounds. The light-emitting layer emits blue light and provides good luminance and reduced drive voltage.

8 Claims, 1 Drawing Sheet

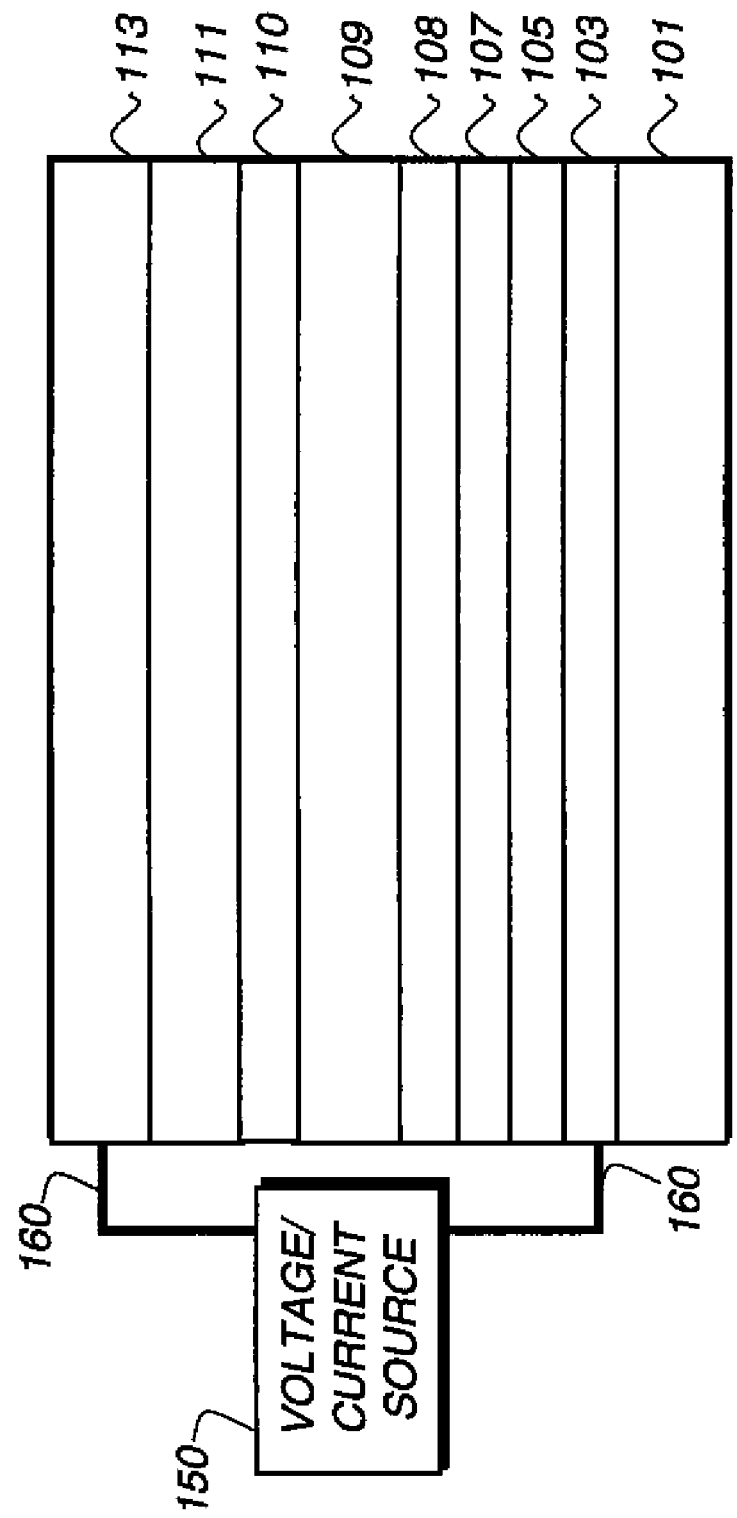

US 7,588,839 B2

ELECTROLUMINESCENT DEVICE

FIELD OF THE INVENTION

This invention relates to an organic light emitting diode (OLED) electroluminescent (EL) device comprising a light-emitting layer containing a phosphorescent light-emitting material and a host material that can provide desirable electroluminescent properties.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322-334, 1969; and Dresner U.S. Pat. No. 3,710,167, issued Jan. 9, 1973. The organic layers in these devices, usually composed of a polycyclic aromatic hydrocarbon, were very thick (much greater than 1 µm). Consequently, operating voltages were very high, often >100V.

More recent organic EL devices include an organic EL element consisting of extremely thin layers (e.g. <1.0 µm) between the anode and the cathode. Herein, the term "organic EL element" encompasses the layers between the anode and cathode electrodes. Reducing the thickness lowered the resistance of the organic layer and has enabled devices that operate much lower voltage. In a basic two-layer EL device structure, described first in U.S. Pat. No. 4,356,429, one organic layer of the EL element adjacent to the anode is specifically chosen to transport holes, therefore, it is referred to as the hole-transporting layer, and the other organic layer is specifically chosen to transport electrons, referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by Tang et al [*J Applied Physics*, Vol. 65, Pages 3610-3616, 1989]. The light-emitting layer commonly consists of a host material doped with a guest material. Still further, there has been proposed in U.S. Pat. No. 4,769,292 a four-layer EL element comprising a hole-injecting layer (HIL), a hole-transporting layer (HTL), a light-emitting layer (LEL) and an electron transport/injection layer (ETL). These structures have resulted in improved device efficiency.

Many emitting materials that have been described as useful in an OLED device emit light from their excited singlet state by fluorescence. The excited singlet state is created when excitons formed in an OLED device transfer their energy to the excited state of the dopant. However, it is generally believed that only 25% of the excitons created in an EL device are singlet excitons. The remaining excitons are triplet, which cannot readily transfer their energy to the singlet-excited state of a dopant. This results in a large loss in efficiency since 75% of the excitons are not used in the light emission process.

Triplet excitons can transfer their energy to a dopant if it has a triplet excited state that is low enough in energy. If the triplet state of the dopant is emissive, it can produce light by phosphorescence. In many cases, singlet excitons can also transfer their energy to lowest singlet excited state of the same dopant. The singlet excited state can often relax, by an intersystem crossing process, to the emissive triplet excited state. Thus, it is possible, by the proper choice of host and dopant, to collect energy from both the singlet and triplet excitons created in an OLED device and to produce a very efficient phosphorescent emission.

Singlet and triplet states, and fluorescence, phosphorescence, and intersystem crossing are discussed in J. G. Calvert and J. N. Pitts, Jr., *Photochemistry* (Wiley, N.Y., 1966). Emission from triplet states is generally very weak for most organic compounds because the transition from triplet-excited state to singlet ground state is spin-forbidden. However, it is possible for compounds with states possessing a strong spin-orbit coupling interaction to emit strongly from triplet-excited states to the singlet ground state (phosphorescence). One such strongly phosphorescent compound is fac-tris(2-phenyl-pyridinato-N^C—)Iridium(III)(Ir(ppy)$_3$) that emits green light (K. A. King, P. J. Spellane, and R. J. Watts, *J Am. Chem. Soc.*, 107, 1431 (1985), M. G. Colombo, T. C. Brunold, T. Reidener, H. U. Güdel, M. Fortsch, and H.-B. Bürgi, *Inorg. Chem.*, 33, 545 (1994)). Organic electroluminescent devices having high efficiency have been demonstrated with Ir(ppy)$_3$ as the phosphorescent material and 4,4'-N,N'-dicarbazole-biphenyl (CBP) as the host (M. A. Baldo, S. Lamansky, P. E. Burrows, M. E. Thompson, S. R. Forrest, *AppL. Phys. Lett.*, 75, 4 (1999), T. Tsutsui, M.-J. Yang, M. Yahiro, K. Nakamura, T. Watanabe, T. Tsuji, Y. Fukuda, T. Wakimoto, S. Miyaguchi, *Jpn. J. Appl. Phys.*, 38, L1502 (1999)). Additional disclosures of phosphorescent materials and organic electroluminescent devices employing these materials are found in U.S. Pat. No. 6,303,238 B1, WO 00/57676, WO 00/70655 and WO 01/41512 A1

In order to get efficient light emission, it is desirable that the triplet energy of the host material be higher than the corresponding energy of the phosphorescent dopant material. In the case of phosphorescent materials that emit blue light, most common host materials, such as CBP, do not have high enough triplet energies to act as efficient hosts. Thus there is a need for new triplet host materials and in particular materials with very high triplet energies.

There have been a number of new host materials that have been developed including those described by C. Chen and co-workers, *Adv. Mater.*, 285 (2005), M. E. Thompson and co-workers, *Appl. Phys. Lett.*, 3818 (2003), and M. E. Thompson and co-workers, US 2004/0209116. Many of these materials do not have charge-carrying abilities and in some cases, when incorporated in an OLED device, they can result in high drive voltages.

Notwithstanding these developments, there remains a need for new host materials, and especially hosts that will function with phosphorescent materials that emit blue light and that provide good luminance and reduced drive voltage.

SUMMARY OF THE INVENTION

The invention provides an OLED device comprising a cathode and an anode and having located therebetween a light-emitting layer comprising a phosphorescent light-emitting material and a host comprising a compound of a tetravalent atom wherein the four groups bonded to the atom are aromatic rings, at least one of which contains an electron-withdrawing group (EWG) substituent comprising at least three atoms, the compound having a triplet energy of at least 2.7 eV and a LUMO energy within 0.6 eV of the LUMO energy of at least one material in an adjacent layer on the cathode side of the light-emitting layer. Particular embodiments include certain tetravalent silicon compounds.

The light-emitting layer emits blue light and provides good luminance and reduced drive voltage.

BRIEF DESCRIPTION OF THE DRAWINGS

The Figure shows a schematic cross-sectional view of one embodiment of the device of the present invention.

DETAILED DESCRIPTION OF THE INVENTION

The device of the invention is described above. The organic light-emitting device (OLED) of the invention contains a cathode, a light-emitting layer, and an anode in that order. The light-emitting layer includes a phosphorescent light-emitting material and at least one host material.

The host material includes a compound of a tetravalent atom wherein the four groups bonded to the atom are aromatic rings, at least one of which contains an electron-withdrawing group (EWG) substituent. In one embodiment the tetravalent atom is selected from the group consisting of C, Si, Ge, Sn, Pb, Se, Ti, Zr, and Hf. Desirably the tetravalent atom is Si. The four groups bonded to the atom are independently selected aromatic rings such as a benzene ring group, a pyridine ring group or a biphenyl ring group.

At least one of the aromatic rings contains an electron-withdrawing group (EWG) comprising at least 3 atoms. One common measure of a substituent's electron-withdrawing and electron-donating properties is its Hammett σ value. Hydrogen has a Hammett σ value of zero, while electron donating groups have negative Hammett σ values and electron accepting groups have positive Hammett σ values. Lange's *Handbook of Chemistry*, 12th Ed., McGraw Hill, 1979, Table 3-12, pp. 3-134 to 3-138, here incorporated by reference, lists Hammett σ values for a large number of commonly encountered groups. Likewise, the book *Correlation Analysis in Chemistry*, N. B. Chapman and J. Shorter, Editors, Plenum Press, London also has a compilation of Hammett values.

Hammett σ values are assigned based on phenyl ring substitution, but they provide a practical guide for qualitatively selecting electron donating and accepting groups. σp values refer to substituents that are substituted in the para position and σm describes substituents that are substituted in the meta position. In one embodiment, at least one EWG substituent has a Hammett σp value or a σm value of 0.30 or greater, 0.35 or greater and desirably a value of 0.45 or greater, or even greater than 0.50. Table A below lists examples of substituents and their σ values.

TABLE A

Examples of Hammett values.

| Substituent | σm | σp |
| --- | --- | --- |
| —SO$_2$Me | 0.68 | 0.73 |
| —C=C(CN)$_2$ | 0.55 | 0.70 |
| —SO$_2$Ph | 0.59 | 0.70 |

TABLE A-continued

Examples of Hammett values.

| Substituent | σm | σp |
| --- | --- | --- |
| 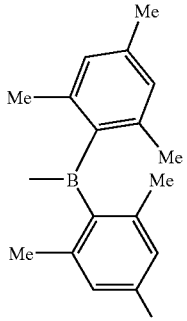 | — | 0.65[1] |
| —SO$_2$NMe$_2$ | 0.48 | 0.63 |
| 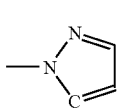 | 0.60 | 0.57 |
| —P(O)Ph$_2$ | 0.38 | 0.53 |
| 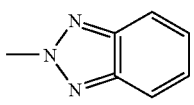 | 0.49 | 0.51 |
| —P(O)Me$_2$ | 0.43 | 0.50 |
| —P(O)Bu$_2$ | 0.35 | 0.49 |
| —S(O)Me | 0.52 | 0.49 |
| —COMe | 0.36 | 0.47 |
| —S(O)Ph | 0.51 | 0.46 |
| 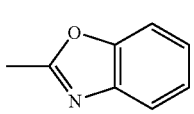 | 0.31 | 0.34 |

[1]See M. E. Gloggowski and J. L. R. Williams, J. Organomet. Chem., 218, 137 (1981)

In another suitable embodiment, the EWG substituent(s) are chosen so the ionization potential of the host compound is between 1.5 eV and 3.0 eV and desirably between 2.5 eV and 3.0 eV. The ionization potential of the host material can be determined form its oxidation potential. Oxidation potentials and reduction potentials can be measured by well-known literature procedures, such as cyclic voltammetry (CV) and Osteryoung square-wave voltammtry (SWV). For a review of electrochemical measurements, see J. O. Bockris and A. K. N. Reddy, *Modern Electrochemistry*, Plenum Press, New York; and A. J. Bard and L. R. Faulkner, *Electrochemical Methods*, John Wiley & Sons, New York, and references cited therein. Redox potentials are always reported versus a reference, such as saturated calomel electrode (SCE).

The host compound has a triplet energy of at least 2.7 eV. Triplet energy is conveniently measured by any of several means, as discussed for instance in S. L. Murov, I. Carmichael, and G. L. Hug, *Handbook of Photochemistry*, 2nd ed. (Marcel Dekker, New York, 1993).

In the absence of experimental data the triplet energies may be estimated in the following manner. The triplet state energy for a molecule is defined as the difference between the ground state energy (E(gs)) of the molecule and the energy of the lowest triplet state (E(ts)) of the molecule, both given in eV.

These energies can be calculated using the B3LYP method as implemented in the Gaussian98 (Gaussian, Inc., Pittsburgh, Pa.) computer program. The basis set for use with the B3LYP method is defined as follows: MIDI! for all atoms for which MIDI! is defined, 6-31G* for all atoms defined in 6-31G* but not in MIDI!, and either the LACV3P or the LANL2DZ basis set and pseudopotential for atoms not defined in MIDI! or 6-31G*, with LACV3P being the preferred method. For any remaining atoms, any published basis set and pseudopotential may be used. MIDI!, 6-31G* and LANL2DZ are used as implemented in the Gaussian98 computer code and LACV3P is used as implemented in the Jaguar 4.1 (Schrodinger, Inc., Portland Oreg.) computer code. The energy of each state is computed at the minimum-energy geometry for that state. The difference in energy between the two states is further modified by Equation 1 to give the triplet state energy (E(t)):

$$E(t)=0.84*(E(ts)-E(gs))+0.35 \quad (1)$$

For polymeric or oligomeric materials, it is sufficient to compute the triplet energy over a monomer or oligomer of sufficient size so that additional units do not substantially change the computed triplet energy of the material The host compound has a LUMO (lowest unoccupied molecular orbital) energy within 0.6 eV and desirably within 0.3 eV of the LUMO energy of at least one material, such as an electron-transporting material, in an adjacent layer on the cathode side of the light-emitting layer. As used herein in this respect, "adjacent" means the layer is juxtaposed to the emitting layer on the cathode side and shares a common boundary. LUMO values for materials can be determined from their reduction potential.

Desirably, the light-emitting layer includes at least one phosphorescent light-emitting compound. Desirably the triplet energy of the phosphorescent compound is less than or equal to the triplet energy of the host material.

In one embodiment the host material is represented by Formula (1).

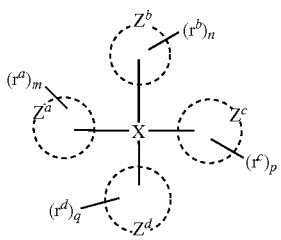

(1)

In Formula (1), X represents C, Si, Ge, Sn, Pb, Se, Ti, Zr, or Hf. Desirably, X represents Si.

$Z^a$ through $Z^d$ independently represent the atoms necessary to complete an aromatic ring group, such as a benzene ring group, a pyridine ring group, or a naphthalene ring group, which may be further substituted. The aromatic rings may be further joined to one another to form additional rings. In one embodiment, the aromatic rings are not further linked to one another. In another suitable embodiment, $Z^a$ through $Z^d$ independently represent the atoms necessary to complete a carbocyclic aromatic ring group.

In Formula (1), m, n, p, and q are independently 0-4, provided that m, n, p, and q are not all 0. Each $r^a$, $r^b$, $r^c$, and $r^d$ represents an independently selected electron-withdrawing substituent. In one embodiment, $r^a$, $r^b$, $r^c$, and $r^d$ are not bonded directly to the parent molecule by means of a nitrogen atom.

In another embodiment at least one of $r^a$, $r^b$, $r^c$, and $r^d$ is represented by Formula (2a).

(2a)

In Formula (2a), $Y^1$ and $Y^2$ represent independently selected substituent groups, such as aromatic groups. $Y^1$ and $Y^2$ may combine to form a ring. Desirably $Y^1$ and $Y^2$ represent aryl groups.

In another aspect of the invention, at least one of $r^a$, $r^b$, $r^c$, and $r^d$ is represented by Formula (2b).

(2b)

In Formula (2b), $Y^3$ and $Y^4$ represent independently selected substituent groups, such as phenyl groups or naphthyl groups. $Y^3$ and $Y^4$ may combine to form a ring group.

In another embodiment at least one of $r^a$, $r^b$, $r^c$, and $r^d$ is represented by Formula (2c).

(2c)

In Formula (2c), $Y^5$ represents a substituent group, such as an aryl group. $Y^6$ represents O, S, or N—$Y^7$, where $Y^7$ represents a substituent group, such as an aryl group. In Formula (2c), $Y^5$ and $Y^7$ may combine to form a ring group.

In another embodiment at least one of $r^a$, $r^b$, $r^c$, and $r^d$ is represented by Formula (2d) or Formula (2e).

(2d)

(2e)

In Formula (2d) or Formula (2e), $Y^8$ and $Y^9$ represent substituent groups, such as aryl groups.

Illustrative examples of suitable host material compounds are listed below.

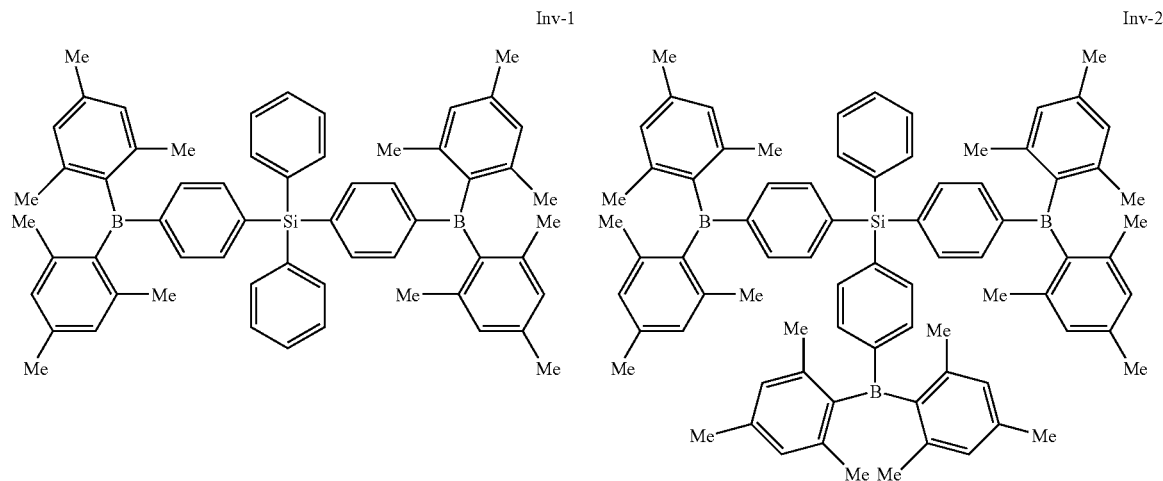
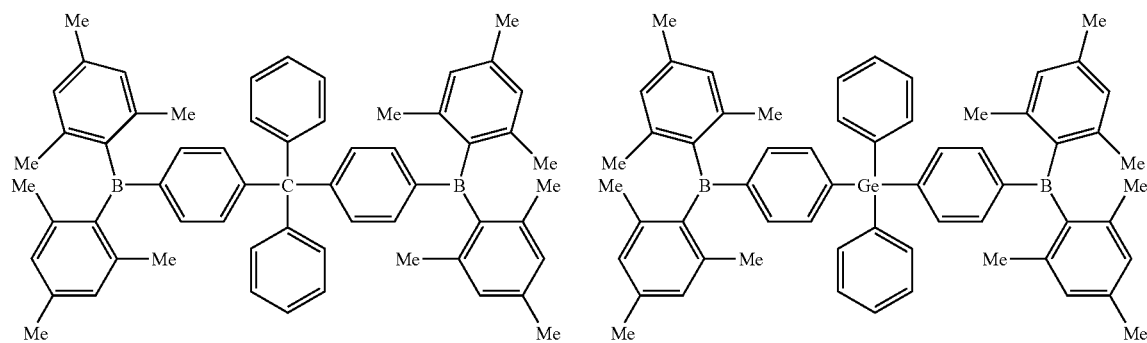
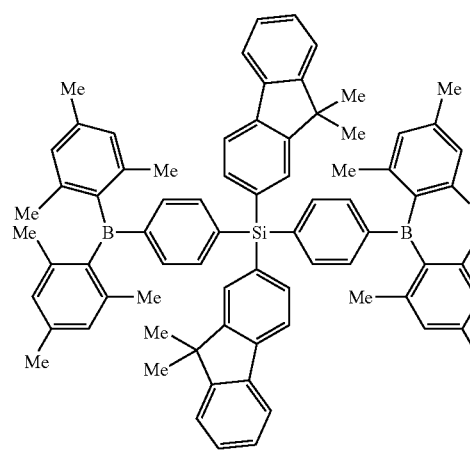
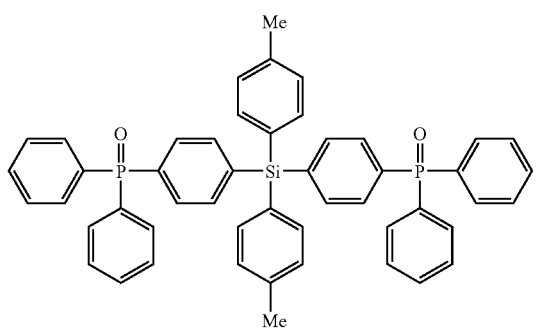

-continued
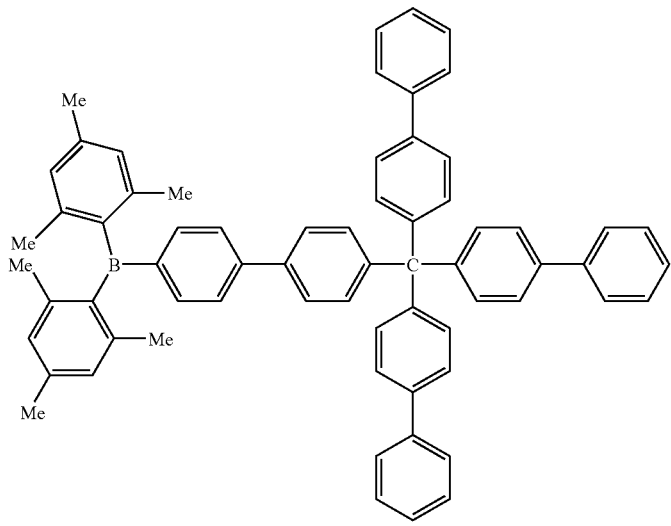
Inv-7
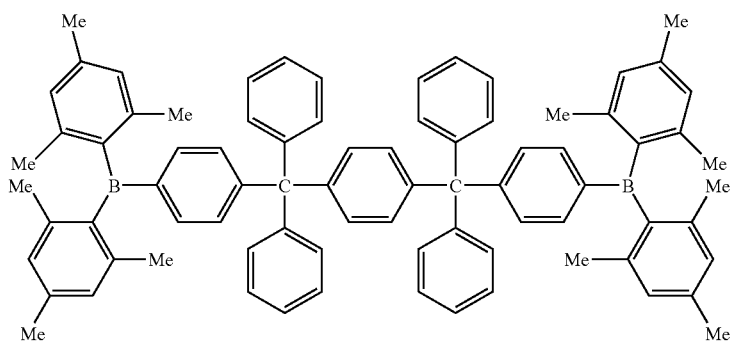
Inv-8
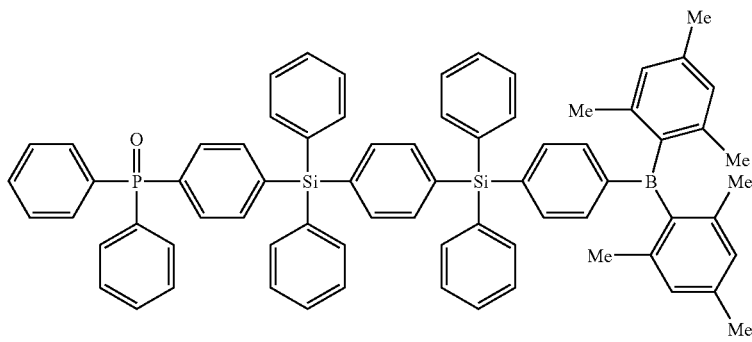
Inv-9

-continued
Inv-10
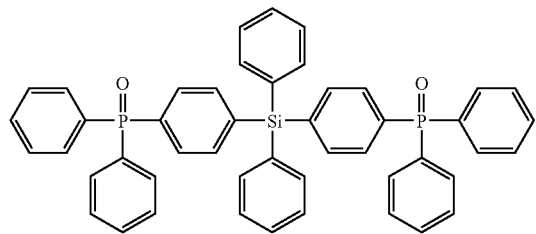
Inv-11
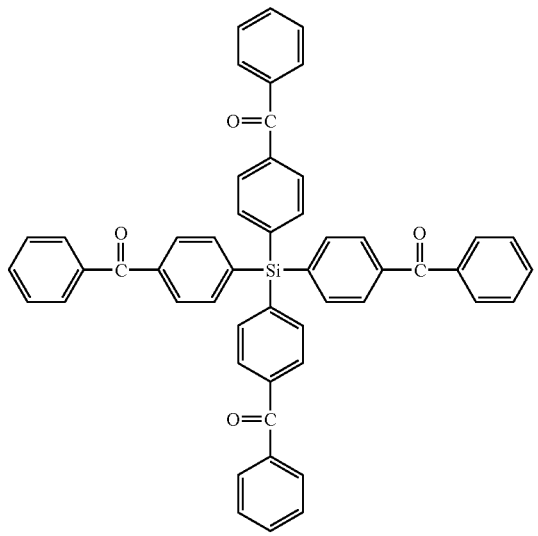
Inv-12
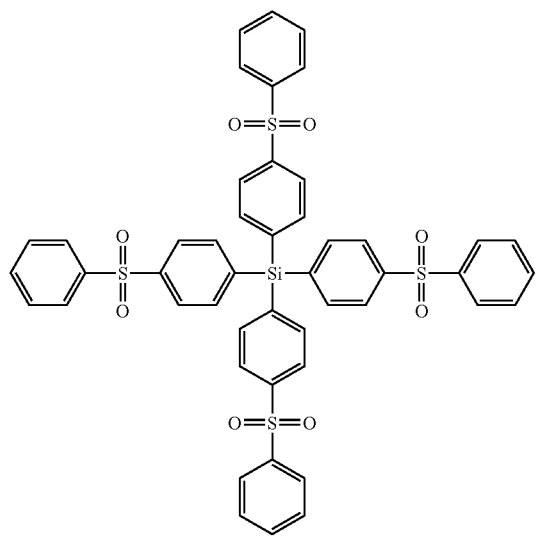
Inv-13
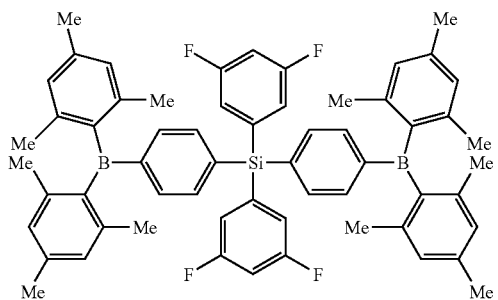
Inv-14
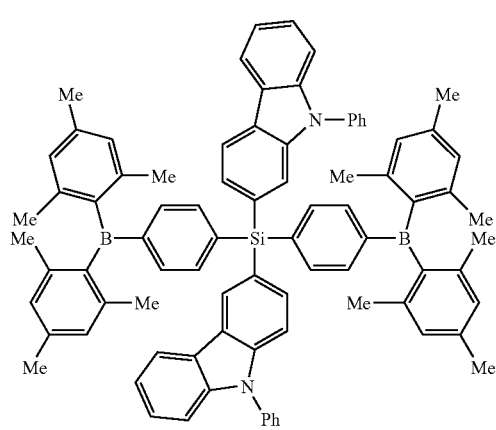
Inv-15
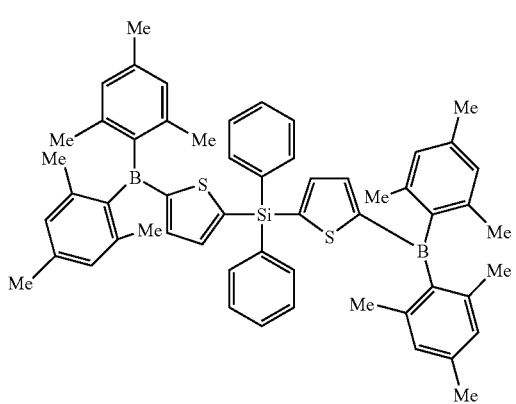

-continued
Inv-16
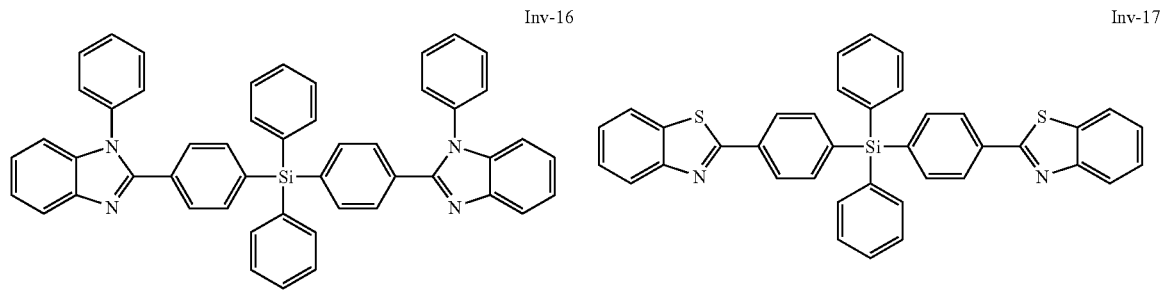
Inv-17
Inv-18
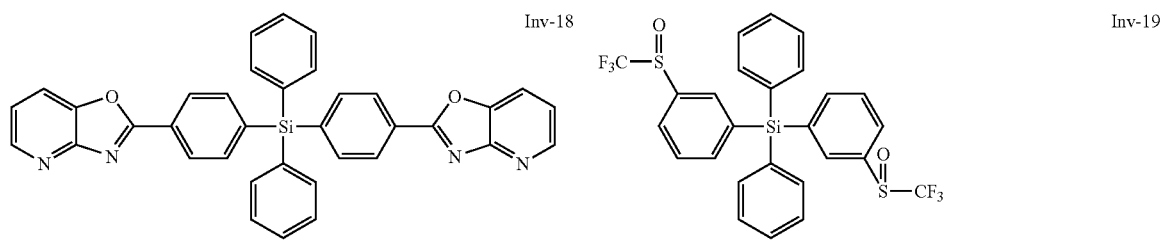
Inv-19
Inv-20
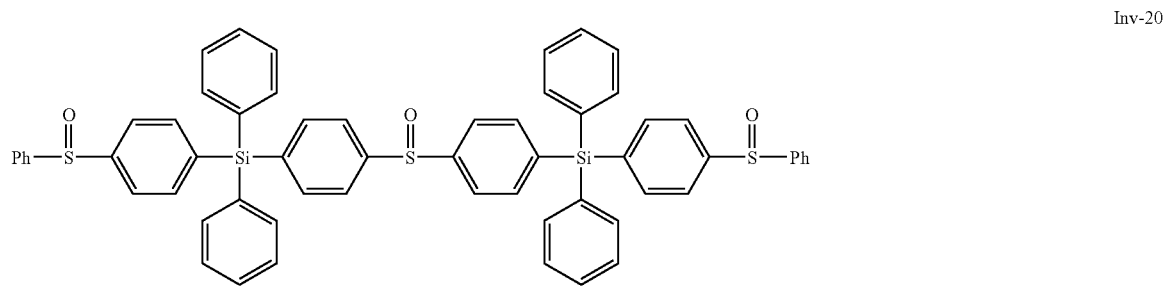
Inv-21
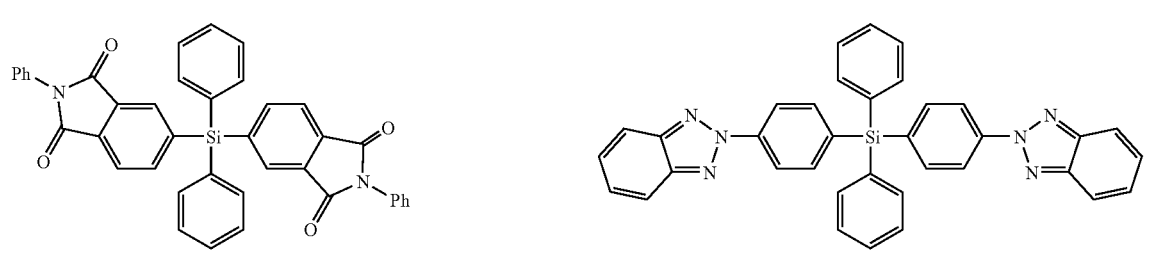
Inv-22

Inv-23
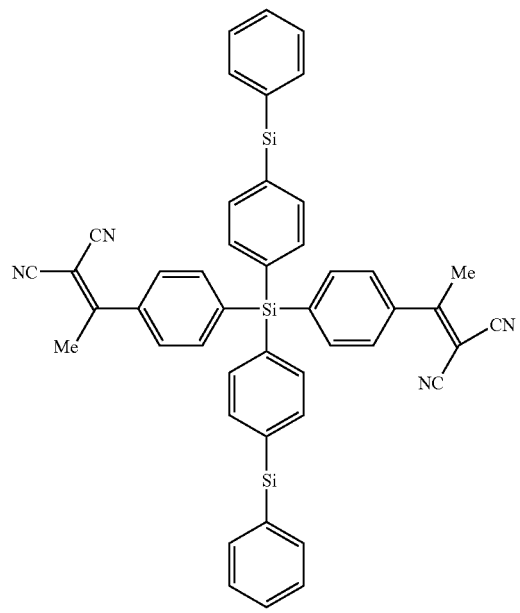
Inv-24
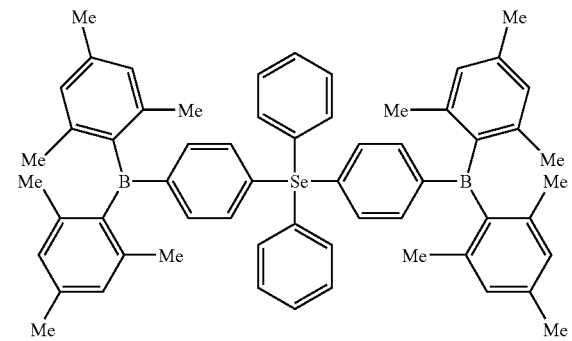
Inv-25
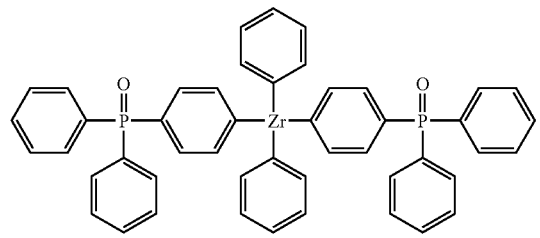
Inv-26
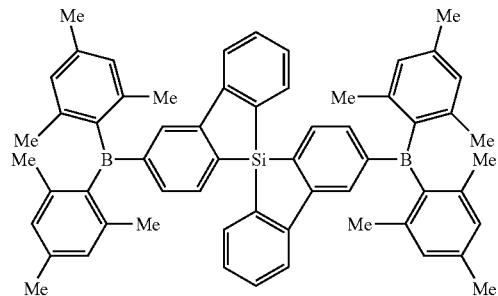
Inv-27
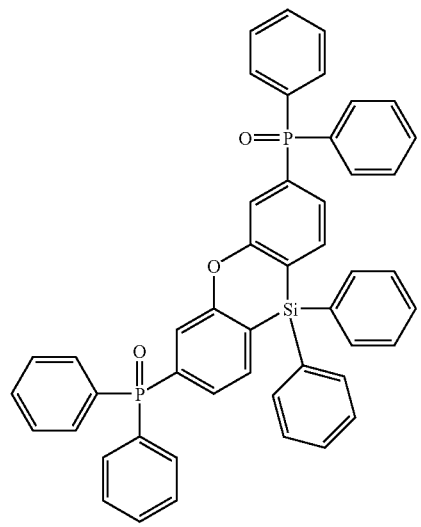

In one aspect of the invention, the host material of the light-emitting layer includes a compound of Formula (1) and at least one additional host compound, also referred to as a co-host, is present. Desirably the co-host is a compound capable of transporting holes.

The light-emitting layer includes at least one phosphorescent light-emitting compound. Desirably this compound has a triplet energy less than or equal to the triplet energy of the host material.

In some embodiments, the phosphorescent complex guest material(s) may be attached to one or more co-host materials. The co-host materials may further be polymers. For convenience, the phosphorescent complex material may be referred to herein as a phosphorescent guest material or emitter.

Particularly useful phosphorescent materials are described by Formula (AA) below:

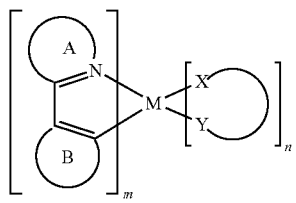

(AA)

wherein:

A represents a substituted or unsubstituted heterocyclic ring containing at least one nitrogen atom;

B represents a substituted or unsubstituted aromatic or heteroaromatic ring, or ring containing a vinyl carbon bonded to M;

X—Y is an anionic bidentate ligand;

m is an integer from 1 to 3 and n in an integer from 0 to 2 such that m+n=3 for M=Rh or Ir; or m is an integer from 1 to 2 and n in an integer from 0 to 1 such that m+n=2 for M=Pt or Pd.

Compounds according to Formula (AA) may be referred to as C,N-(or C^N—) cyclometallated complexes to indicate that the central metal atom is contained in a cyclic unit formed by bonding the metal atom to carbon and nitrogen atoms of one or more ligands. Examples of heterocyclic ring A in Formula (AA) include substituted or unsubstituted pyridine, quinoline, isoquinoline, pyrimidine, indole, indazole, thiazole, and oxazole rings. Examples of ring B in Formula (AA) include substituted or unsubstituted phenyl, naphthyl, thienyl, benzothienyl, furanyl rings. Ring B in Formula (AA) may also be a N-containing ring such as pyridine, with the proviso that the N-containing ring bonds to M through a C atom as shown in Formula (AA) and not the N atom.

In one embodiment, the phosphorescent emitting material comprises an organometallic complex comprising a metal and at least one ligand, wherein the metal is selected from the group consisting of Ir, Rh, Ru, Pt, and Pd. Desirably the metal is Ir.

In one suitable embodiment, the phosphorescent light-emitting compound is a tris-C^N-cyclometallated Iridium complex. Here the term "C^N-cyclometallated" describes bidentate ligands that bond to the central Iridium atom through a metal-carbon bond and through coordination to a nitrogen atom. The compounds having three C^N-cyclometallating ligands provide higher device operational stability than compounds having only two C^N-cyclometallating ligands and the remaining coordinating sites occupied by other types of ancillary ligands, such as acetylacetonate or a Schiff base such as the deprotonated from of picolinic acid. The tris-C^N-cyclometallated Iridium complexes may be facial or meridional isomers. The facial isomers are usually preferred since they are often found to have higher emission quantum yield than meridional isomers. One example of a tris-C^N-cyclometallated Iridium complex is tris(2-phenyl-pyridinato-N^C-)Iridium(III), shown below in stereodiagrams as facial (fac-) or meridional (mer-) isomers.

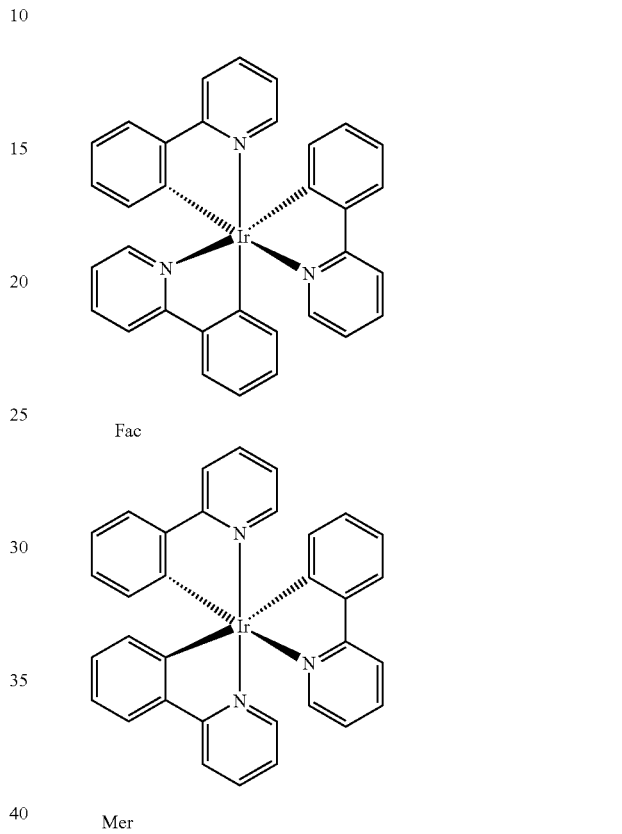

Fac

Mer

Tris-C,N-cyclometallated phosphorescent materials also include compounds according to Formula (AA) wherein the monoanionic bidentate ligand X—Y is another C,N-cyclometallating ligand. Examples include bis(1-phenylisoquinolinato-N,C$^{2'}$)(2-phenylpyridinato-N,C$^{2'}$)Iridium(III) and bis (2-phenylpyridinato-N,C$^{2'}$)(1-phenylisoquinolinato-N,C$^{2'}$) Iridium(III). Synthesis of such tris-C,N-cyclometallated complexes containing two different C,N-cyclometallating ligands may be conveniently synthesized by the following steps. First, a bis-C,N-cyclometallated diiridium dihalide complex (or analogous dirhodium complex) is made according to the method of Nonoyama (*Bull. Chem. Soc. Jpn.*, 47, 767 (1974)). Secondly, a zinc complex of the second, dissimilar C,N-cyclometallating ligand is prepared by reaction of a zinc halide with a lithium complex or Grignard reagent of the cyclometallating ligand. Third, the thus formed zinc complex of the second C,N-cyclometallating ligand is reacted with the previously obtained bis-C,N-cyclometallated diiridium dihalide complex to form a tris-C,N-cyclometallated complex containing the two different C,N-cyclometallating ligands. Desirably, the thus obtained tris-C,N-cyclometallated complex containing the two different C,N-cyclometallating ligands may be converted to an isomer wherein the C atoms bonded to the metal (e.g. Ir) are all mutually cis by heating in a suitable solvent such as dimethyl sulfoxide.

Suitable phosphorescent materials according to Formula (AA) may, in addition to the C,N-cyclometallating ligand(s), also contain monoanionic bidentate ligand(s) X—Y that are not C,N-cyclometallating. Common examples are beta-diketonates such as acetylacetonate, and Schiff bases such as picolinate. Examples of such mixed ligand complexes according to Formula (AA) include bis(2-phenylpyridinato-N,C$^{2'}$)Iridium(III)(acetylacetonate),bis(2-(2'-benzothienyl) pyridinato-N,C$^{3'}$)Iridium(III)(acetylacetonate), and bis(2-(4',6'-diflourophenyl)-pyridinato-N,C$^{2'}$)Iridium(III) (picolinate).

Other important phosphorescent materials according to Formula (AA) include C,N-cyclometallated Pt(II) complexes such as cis-bis(2-phenylpyridinato-N,C$^{2'}$)platinum(II), cis-bis(2-(2'-thienyl)pyridinato-N,C$^{3'}$) platinum(II), cis-bis(2-(2'-thienyl)quinolinato-N,C$^{5'}$) platinum(II), or (2-(4',6'-difluorophenyl)pyridinato-N,C$^{2'}$) platinum (II) (acetylacetonate).

The emission wavelengths (color) of C,N-cyclometallated phosphorescent materials according to Formula (AA) are governed principally by the lowest energy optical transition of the complex and hence by the choice of the C,N-cyclometallating ligand. For example, 2-phenyl-pyridinato-N,C$^{2'}$ complexes are typically green emissive while 1-phenyl-isoquinolinolato-N,C$^{2'}$ complexes are typically red emissive. In the case of complexes having more than one C,N-cyclometallating ligand, the emission will be that of the ligand having the property of longest wavelength emission. Emission wavelengths may be further shifted by the effects of substituent groups on the C,N-cyclometailating ligands. For example, substitution of electron donating groups at appropriate positions on the N-containing ring A or electron accepting groups on the C-containing ring B tend to blue-shift the emission relative to the unsubstituted C,N-cyclometallated ligand complex. Selecting a monodentate anionic ligand X,Y in Formula (AA) having more electron accepting properties also tends to blue-shift the emission of a C,N-cyclometallated ligand complex. Examples of complexes having both monoanionic bidentate ligands possessing electron accepting properties and electron accepting substituent groups on the C-containing ring B include bis(2-(4',6'-difluorophenyl)-pyridinato-N,C$^{2'}$)iridium(III)(picolinate) and bis(2-(4',6'-difluorophenyl)-pyridinato-N,C$^{2'}$)iridium(III)(tetrakis(1-pyrazolyl)borate).

The central metal atom in phosphorescent materials according to Formula (AA) may be Rh or Ir (m+n=3) and Pd or Pt (m+n=2). Preferred metal atoms are Ir and Pt since they tend to give higher phosphorescent quantum efficiencies according to the stronger spin-orbit coupling interactions generally obtained with elements in the third transition series.

In addition to bidentate C,N-cyclometallating complexes represented by Formula AA, many suitable phosphorescent emitters contain multidentate C,N-cyclometallating ligands. Phosphorescent emitters having tridentate ligands suitable for use in the present invention are disclosed in U.S. Pat. No. 6,824,895 B1 and U.S. Ser. No. 10/729,238 (pending) and references therein, incorporated in their entirety herein by reference. Phosphorescent emitters having tetradentate ligands suitable for use in the present invention are described by the following:

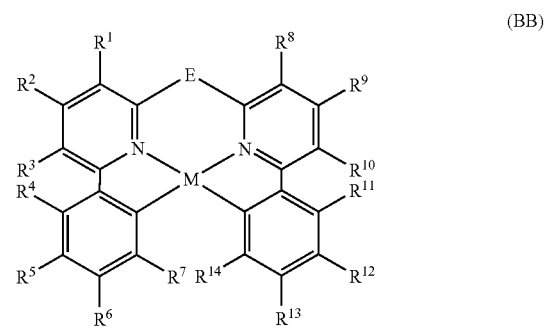

(BB)

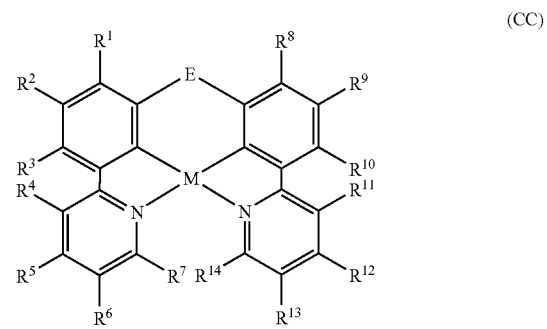

(CC)

wherein:

M is Pt or Pd;

R$^1$-R$^7$ represent hydrogen or independently selected substituents, provided that R$^1$ and R$^2$, R$^2$ and R$^3$, R$^3$ and R$^4$, R$^4$ and R$^5$, R$^5$ and R$^6$, as well as R$^6$ and R$^7$ may join to form a ring group;

R$^8$-R$^{14}$ represent hydrogen or independently selected substituents, provided that R$^8$ and R$^9$, R$^9$ and R$^{10}$, R$^{10}$ and R$^{11}$, R$^{11}$ and R$^{12}$, R$^{12}$, and R$^{13}$, as well as R$^{13}$ and R$^{14}$, may join to form a ring group;

E represents a bridging group selected from the following:

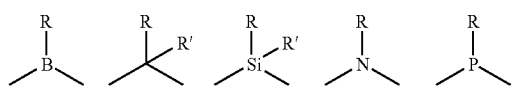

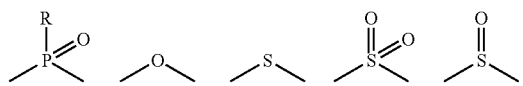

wherein R and R' represent hydrogen or independently selected substituents;

provided R and R' may combine to form a ring group.

In one desirable embodiment, the tetradentate C,N-cyclometallated phosphorescent emitter suitable for use in the present invention is represented by the following Formula:

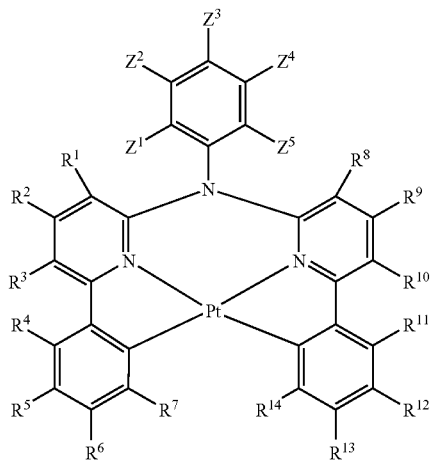

(DD)

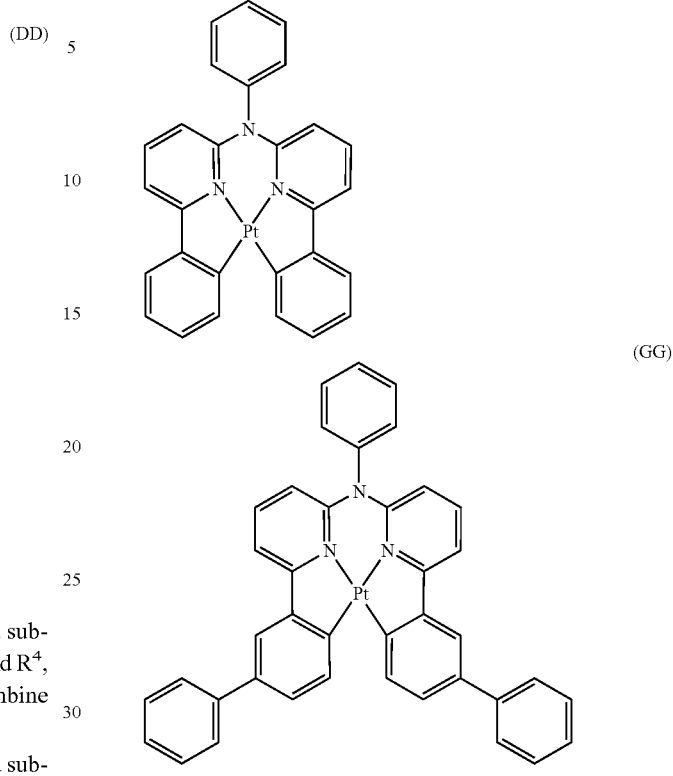

(FF)

(GG)

wherein,

R$^1$-R$^7$ represent hydrogen or independently selected substituents, provided that R$^1$ and R$^2$, R$^2$ and R$^3$, R$^3$ and R$^4$, R$^4$ and R$^5$, R$^5$ and R$^6$, as well as R$^6$ and R$^7$ may combine to form a ring group;

R$^8$-R$^{14}$ represent hydrogen or independently selected substituents, provided that R$^8$ and R$^9$, R$^9$ and R$^{10}$, R$^{10}$ and R$^{11}$, R$^{11}$ and R$^{12}$, R$^{12}$ and R$^{13}$, as well as R$^{13}$ and R$^{14}$ may combine to form a ring group;

Z$^1$-Z$^5$ represent hydrogen or independently selected substituents, provided that Z$^1$ and Z$^2$, Z$^2$ and Z$^3$, Z$^3$ and Z$^4$, as well as Z$^4$ and Z$^5$ may combine to form a ring group.

Specific examples of phosphorescent emitters having tetradentate C,N-cyclometallating ligands suitable for use in the present invention include compounds X, Y, and Z represented below.

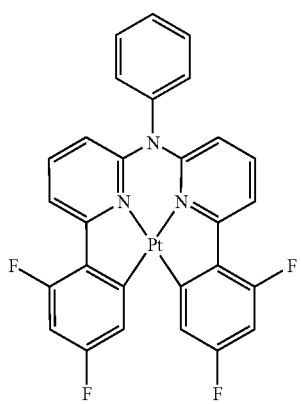

(EE)

Phosphorescent emitters having tetradentate C,N-cyclometallating ligands may be synthesized by reacting the tetradentate C,N-cyclometallating ligand with a salt of the desired metal, such as K$_2$PtCl$_4$, in a proper organic solvent such as glacial acetic acid to form the phosphorescent emitter having tetradentate C,N-cyclometallating ligands. A tetraakylammonium salt such as tetrabutylammonium chloride can be used as a phase transfer catalyst to accelerate the reaction.

Other phosphorescent materials that do not involve C,N-cyclometallating ligands are known. Phosphorescent complexes of Pt(II), Ir(I), and Rh(I) with maleonitriledithiolate have been reported (C. E. Johnson et al., *J. Am. Chem. Soc.,* 105, 1795 (1983)). Re(I) tricarbonyl diimine complexes are also known to be highly phosphorescent (M. Wrighton and D. L. Morse, *J Am. Chem. Soc.,* 96, 998 (1974); D. J. Stufkens, *Comments Inorg. Chem.,* 13, 359 (1992); V. W. W. Yam, *Chem. Commun.,* 789 (2001)). Os(II) complexes containing a combination of ligands including cyano ligands and bipyridyl or phenanthroline ligands have also been demonstrated in a polymer OLED (Y. Ma et al., *Synthetic Metals,* 94, 245 (1998)).

Porphyrin complexes such as 2,3,7,8,12,13,17,18-octaethyl-21H, 23H-porphine platinum(II) are also useful phosphorescent materials.

Still other examples of useful phosphorescent materials include coordination complexes of the trivalent lanthanides such as Tb$^{3+}$ and Eu$^{3+}$ (J. Kido et al., *Chem. Lett.,* 657 (1990); *J. Alloys and Compounds,* 192, 30 (1993); *Jpn. J. Appl. Phys.,* 35, L394 (1996) and *Appl. Phys. Lett.,* 65, 2124 (1994)).

Additional information on suitable phosphorescent materials and synthetic methods, incorporated herein by reference, can be found in U.S. Pat. No. 6,303,238 B1, WO 00/57676, WO 00/70655, WO 01/41512 A1, US 2002/0182441 A1, US 2003/0017361 A1, US 2003/ 0072964 A1, U.S. Pat. No. 6,413,656 B1, U.S. Pat. No. 6,687,266 B1, US 2004/0086743 A1, US 2004/0121184 A1, US 2003/0059646 A1, US 2003/0054198 A1, EP 1 239 526 A2, EP 1 238 981 A2, EP 1 244 155 A2, US 2002/0100906 A1, US 2003 / 0068526 A1, US 2003/0068535 A1, JP 2003073387A, JP 2003 073388A, U.S. Pat. No. 6,677,060 B2, US 2003/0235712 A1, US 2004/0013905 A1, U.S. Pat. No. 6,733,905 B2, U.S. Pat. No. 6,780,528 B2, US 2003/0040627 A1, JP 2003059667A, JP 2003073665A, US 2002/0121638 A1, EP 1371708AL, US 2003/010877 A1, WO 03/040256 A2, US 2003/0096138 A1, US 2003/0173896 A1, U.S. Pat. No. 6,670,645 B2, US 2004/0068132 A1, WO 2004/015025 A1, US 2004/0072018 A1, US 2002/0134984 A1, WO 03/079737 A2, WO 2004/020448 A1, WO 03/091355 A2, U.S. Ser. No. 10/729,402, U.S. Ser. No. 10/729,712, U.S. Ser. No. 10/729,738, U.S. Ser. No. 10/729, 238, U.S. Ser. No. 10/729,246 (now allowed), U.S. Ser. No. 10/729,207 (now allowed), U.S. Ser. No. 10/729,263 (now allowed), U.S. Ser. No. 10/879,412, and U.S. Ser. No. 10/879, 657.

Tris-C^N-cyclometallated Iridium complexes employed in the present invention may be synthesized according to literature methods or methods disclosed in pending applications Deaton et al U.S. Ser. Nos. 10/729,263, and 10/879,412, and 10/ 879,657 and references therein. Additional examples of tris-C^N-cyclometallated compounds may be found within these same references and references therein, incorporated herein in their entirety. Particularly useful ligands for the tri-C^N-cyclometallated Iridium complexes of the present invention are substituted or unsubstituted 2-phenyl quinolines, 1-phenyl isoquinolines, and 3-phenyl isoquinolines.

In many known hosts and device architectures for phosphorescent OLEDs, the optimum concentration of the phosphorescent dopant for luminous efficiency is found to be about 1 to 20 vol % and often 6 to 8 vol % relative to the host material.

Illustrative examples of useful phosphorescent light-emitting materials are shown below.

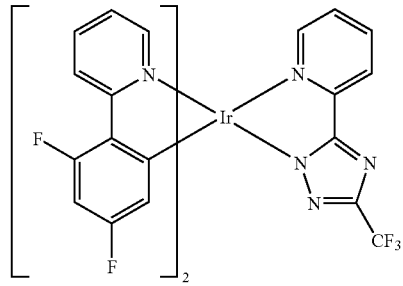

D-1

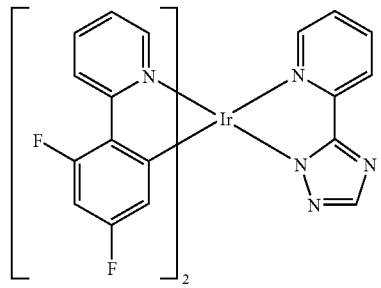

D-2

-continued

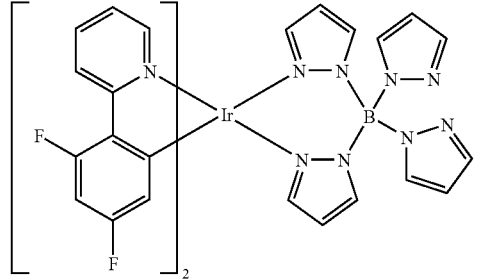

D-3

D-4

D-5

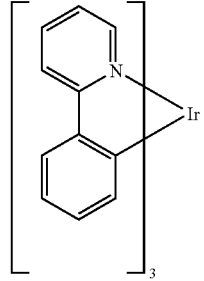

D-6

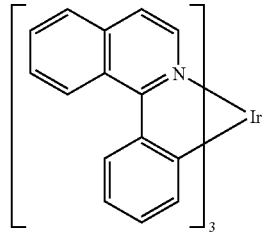

D-7

-continued
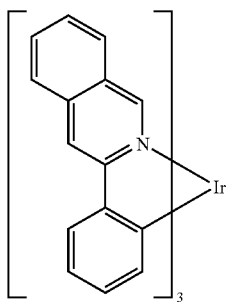
D-8
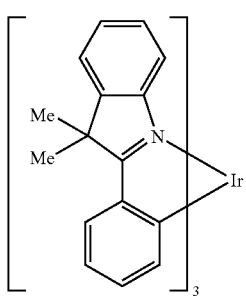
D-9
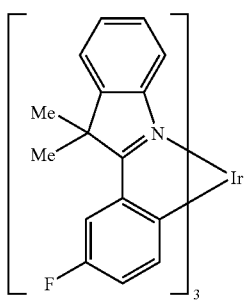
D-10
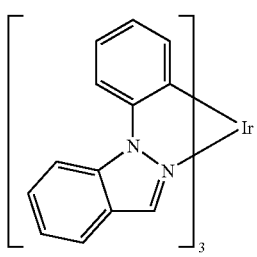
D-11
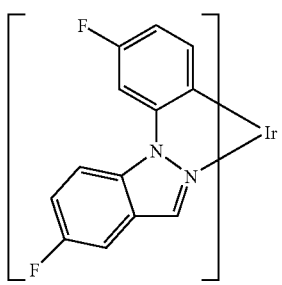
D-12
-continued
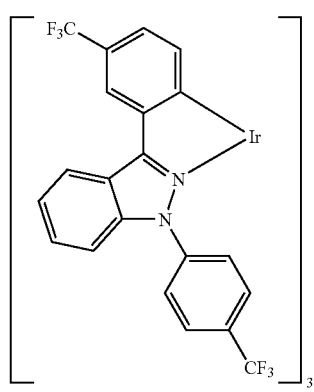
D-13
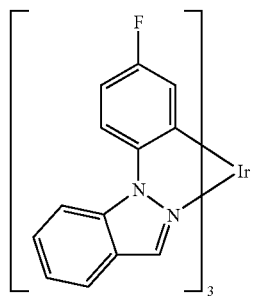
D-14
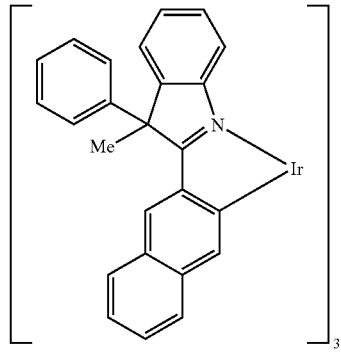
D-15
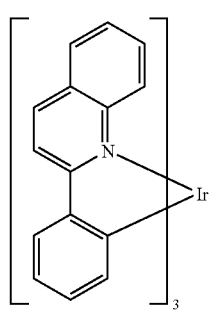
D-16

-continued

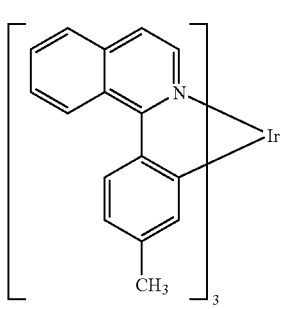
D-17

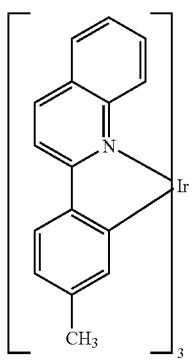
D-18

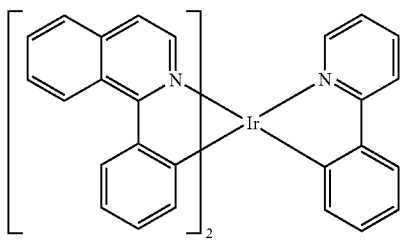
D-19

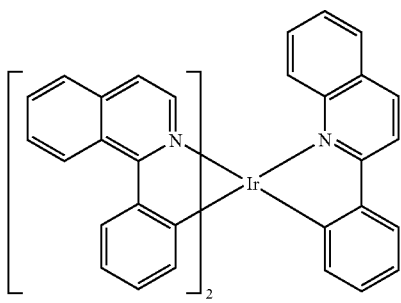
D-20

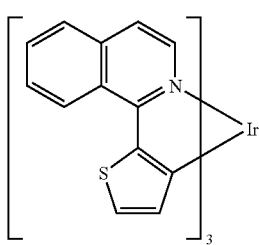
D-21

In one desirable embodiment at least one phosphorescent material present in the LEL emits light in the range of 450 to 480 nm.

In addition to suitable hosts, an EL device employing a phosphorescent material often is more efficient if there is at least one exciton- or hole-blocking layer on the cathode side of the emitting layer. Efficiency can also often be improved if there are one or more exciton- or electron-blocking layers on the anode side of the emitting layer. These additional layers help confine the excitons or electron-hole recombination centers to the light-emitting layer comprising the host and emitting material.

An exciton- or hole-blocking layer is desirably placed between the electron-transporting layer and the light-emitting layer, Layer 109 in the FIGURE. The ionization potential of the blocking layer should be such that there is an energy barrier for hole migration from the host into the electron-transporting layer, while the electron affinity should be such that electrons pass more readily from the electron-transporting layer into the light-emitting layer comprising host and phosphorescent material. It is further desired, but not absolutely required, that the triplet energy of the blocking material be greater than that of the phosphorescent material. Suitable hole-blocking materials are described in WO 00/70655A2 and WO 01/93642 A1. Two examples of useful materials are bathocuproine (BCP) and bis(2-methyl-8-quinolinolato)(4-phenylphenolato)Aluminum(III)(BAlq). Metal complexes other than BAlq are also known to block holes and excitons as described in US 20030068528.

In one embodiment, the hole-blocking layer includes a material of Formula (1). Suitably, the hole-blocking layer comprises 25%, or 50%, or 75%, or even 100% of Formula (1).

In another embodiment, an exciton- or electron-blocking layer (layer 108 in the FIGURE) would be placed between the hole-transporting layer and the light-emitting layer. As an example, US 2003/0175553 describes the use of fac-tris(1-phenylpyrazolato-N,C 2)iridium(III)(Irppz) in an electron/exciton blocking layer. U.S. Ser. No. 11/016,108 of Marina E. Kondakova et al., filed Dec. 17, 2004, describes further examples of exciton-blocking layers. Desirably the triplet energy of the blocking material should greater than that of the phosphorescent material in the LEL. Depending on the nature of the hole-transporting material and the configuration of the LEL, the blocking layer, in certain cases, can be entirely omitted.

In another aspect of the invention an OLED device comprises a cathode and an anode and having located therebetween a layer comprising a compound of Formula (3a):

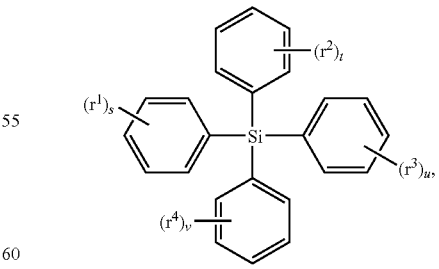

(3a)

In Formula (3a), s, t, u, and v are independently 0-5, provided that s, t, u, and v are not all 0. Each $r^1$ through $r^4$ represents an independently selected substituent, provided at least one $r^1$ through $r^4$ comprises a substituent of Formula (3b):

(3b)

In Formula (3b), each Ar¹ may be the same or different and each represents an independently selected aromatic group, such as a phenyl group or a pyridyl group.

In further aspect of the invention, an OLED device comprises a cathode and an anode and having located therebetween a layer comprising a compound of Formula (3c):

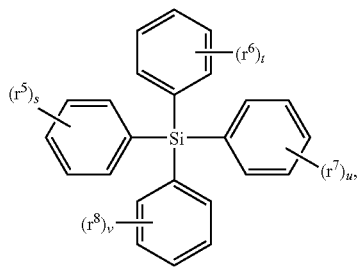
(3c)

In Formula (3c), s, t, u, and v are independently 0-5, provided that s, t, u, and v are not all 0. Each $r^5$ through $r^8$ represents an independently selected substituent, provided at least one $r^5$ through $r^8$ comprises a substituent of Formula (3d):

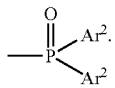
(3d)

In Formula (3d), each Ar² may be the same or different and each represents an independently selected aromatic group, such as a phenyl group or a pyridyl group.

Unless otherwise specifically stated, use of the term "substituted" or "substituent" means any group or atom other than hydrogen. Unless otherwise provided, when a group, compound or formula containing a substitutable hydrogen is referred to, it is also intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino,p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecyl-benzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur or phosphorous, such as pyridyl, thienyl, furyl, azolyl, thiazolyl, oxazolyl, imidazolyl, pyrazolyl, pyrazinyl, pyrimidinyl, pyrolidinonyl, quinolinyl, isoquinolinyl, 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

As discussed previously, it is well within the skill of the art to determine whether a particular group is electron donating or electron accepting. The most common measure of electron donating and accepting properties is in terms of Hammett σ values.

Suitable electron donating groups may be selected from —R', —OR', and —NR'(R") where R' is a hydrocarbon containing up to 6 carbon atoms and R" is hydrogen or R'. Specific examples of electron donating groups include methyl, ethyl, phenyl, methoxy, ethoxy, phenoxy, $-N(CH_3)_2$, $-N(CH_2CH_3)_2$, $-NHCH_3$, $-N(C_6H_5)_2$, $-N(CH_3)(C_6H_5)$, and $-NHC_6H_5$.

Suitable electron accepting groups may be selected from the group consisting of cyano, α-haloalkyl, α-haloalkoxy, amido, sulfonyl, carbonyl, carbonyloxy and oxycarbonyl substituents containing up to 10 carbon atoms. Specific examples include $-CN$, $-F$, $-CF_3$, $-OCF_3$, $-CONHC_6H_5$, $-SO_2C_6H_5$, $-COC_6H_5$, $-CO_2C_6H_5$, and $-OCOC_6H_5$.

General Device Architecture

The present invention can be employed in many OLED device configurations using small molecule materials, oligomeric materials, polymeric materials, or combinations thereof. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. The essential requirements of an OLED are an anode, a cathode, and an organic light-emitting layer located between the anode and cathode. Additional layers may be employed as more fully described hereafter.

A typical structure, especially useful for of a small molecule device, is shown in the FIGURE and is comprised of a substrate 101, an anode 103, a hole-injecting layer 105, a hole-transporting layer 107, an electron- or exciton-blocking layer 108, a light-emitting layer 109, a hole- or exciton-blocking layer 110, an electron-transporting layer 111, and a cathode 113. These layers are described in detail below. Note that the substrate may alternatively be located adjacent to the cathode, or the substrate may actually constitute the anode or cathode. The organic layers between the anode and cathode are conveniently referred to as the organic EL element. Also, the total combined thickness of the organic layers is desirably less than 500 nm.

The anode and cathode of the OLED are connected to a voltage/current source 150 through electrical conductors 160. The OLED is operated by applying a potential between the anode and cathode such that the anode is at a more positive potential than the cathode. Holes are injected into the organic EL element from the anode and electrons are injected into the organic EL element at the cathode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

Substrate

The OLED device of this invention is typically provided over a supporting substrate 101 where either the cathode or anode can be in contact with the substrate. The substrate can be a complex structure comprising multiple layers of materials. This is typically the case for active matrix substrates wherein TFTs are provided below the OLED layers. It is still necessary that the substrate, at least in the emissive pixilated areas, be comprised of largely transparent materials. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support can be light transmissive, light absorbing or light reflective. Substrates for use in this case include, but are not limited to, glass, plastic, semiconductor materials, silicon, ceramics, and circuit board materials. It is necessary to provide in these device configurations a light-transparent top electrode.

Anode

When the desired electroluminescent light emission (EL) is viewed through the anode, the anode 103 should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode, any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity.

Hole-Injecting Laver (HIL)

A hole-injecting layer 105 may be provided between the anode and the hole-transporting layer. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. Nos. 6,127,004, 6,208,075 and 6,208,077, some aromatic amines, for example, MTDATA (4,4',4"-tris[(3-methylphenyl)phenylamino]triphenylamine), and inorganic oxides including vanadium oxide (VOx), molybdenum oxide (MoOx), and nickel oxide (NiOx). Alternative hole-injecting materials reportedly useful in organic EL devices are described in EP 0 891 121 A1 and EP 1 029 909 A1.

The thickness of a hole injection layer containing a plasma-deposited fluorocarbon polymer can be in the range of 0.2 nm to 15 nm and suitably in the range of 0.3 to 1.5 nm.

Hole-Transporting Layer (HTL)

It is usually advantageous to have a hole transporting layer 107 deposited between the anode and the emissive layer. A hole transporting material deposited in said hole transporting layer between the anode and the light emitting layer may be the same or different from a hole transporting compound used as a co-host or in exciton blocking layer according to the invention. The hole transporting layer may optionally include a hole injection layer. The hole transporting layer may include more than one hole transporting compound, deposited as a blend or divided into separate layers.

The hole-transporting layer contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines is those which include at least two aromatic tertiary amine moieties as described in U.S. Pat. Nos. 4,720,432 and 5,061,569. Such compounds include those represented by structural formula (HT1):

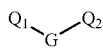

(HT1)

Wherein:

$Q_1$ and $Q_2$ are independently selected aromatic tertiary amine moieties, and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (HT1) and containing two triarylamine moieties is represented by structural formula (HT2):

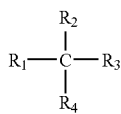

(HT2)

wherein:

$R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural formula (HT3):

(HT3)

wherein:

$R_5$ and $R_6$ are independently selected aryl groups. In one embodiment, at least one of $R_5$ or $R_6$ contains a polycyclic fused ring structure, e.g., a naphthalene.

Another class of aromatic tertiary amines is the tetraaryldiamines. Desirable tetraaryldiamines include two diarylamino groups, such as indicated by formula (HT3), linked through an arylene group. Useful tetraaryldiamines include those represented by formula (HT4):

(HT4)

wherein:

each Are is an independently selected arylene group, such as a phenylene or anthracene moiety, n is an integer of from 1 to 4, and $R_1$, $R_2$, $R_3$, and $R_4$ are independently selected aryl groups. In a typical embodiment, at least one of $R_1$, $R_2$, $R_3$, and $R_4$ is a polycyclic fused ring structure, e.g., a naphthalene.

The various alkyl, alkylene, aryl, and arylene moieties of the foregoing structural formulae (HT1), (HT2), (HT3), (HT4) can each in turn be substituted. Typical substituents include alkyl groups, alkoxy groups, aryl groups, aryloxy groups, and halide such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms, such as cyclopentyl, cyclohexyl, and cycloheptyl ring structures. The aryl and arylene moieties are usually phenyl and phenylene moieties.

The hole transporting layer can be formed of a single tertiary amine compound or a mixture of such compounds. Specifically, one may employ a triarylamine, such as a triarylamine satisfying the formula (HT2), in combination with a tetraaryldiamine, such as indicated by formula (HT4). Illustrative of useful aromatic tertiary amines are the following:

1,1-Bis(4-di-p-tolylaminophenyl)cyclohexane (TAPC);
1,1-Bis(4-di-p-tolylaminophenyl)-4-phenylcyclohexane;
N,N,N',N'-tetraphenyl-4,4'''-diamino-1,1':4',1":4",1'''-quaterphenyl;
Bis(4-dimethylamino-2-methylphenyl)phenylmethane;
1,4-bis[2-[4-[N,N-di(p-tolyl)amino]phenyl]vinyl]benzene (BDTAPVB);
N,N,N',N'-Tetra-p-tolyl-4,4'-diaminobiphenyl;
N,N,N',N'-Tetraphenyl-4,4'-diaminobiphenyl;
N,N,N',N'-tetra-1-naphthyl-4,4'-diaminobiphenyl;

N,N,N',N'-tetra-2-naphthyl-4,4'-diaminobiphenyl;
N-Phenylcarbazole;
4,4'-Bis[N-(1-naphthyl)-N-phenylamino]biphenyl (NPB);
4,4'-Bis[N-(3-methylphenyl)-N-phenylamino]biphenyl (TPD);
4,4'-Bis[N-(1-naphthyl)-N-(2-naphthyl)amino]biphenyl (TNB);
4,4'-Bis[N-(1-naphthyl)-N-phenylamino]p-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4'-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl;
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1 -coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4"-diamino-p-terphenyl;
4,4'-Bis {N-phenyl-N-[4-(1-naphthyl)-phenyl]amino}biphenyl;
2,6-Bis[N,N-di(2-naphthyl)amino]fluorine;
4,4',4"-tris[(3-methylphenyl)phenylamino]triphenylamine(MTDATA);
N,N-bis[2,5-dimethyl4-[(3-methylphenyl)phenylamino]phenyl]-2,5-dimethyl-N'-(3-methylphenyl)-N'-phenyl-1,4-benzenediamine;
4-(9H-carbazol-9-yl)-N,N-bis[4-(9H-carbazol-9-yl)phenyl]-benzenamine (TCTA);
4-(3-phenyl-9H-carbazol-9-yl)-N,N-bis[4(3-phenyl-9H-carbazol-9-yl)phenyl]-benzenamine;
9,9'-(2,2'-dimethyl[1,1'-biphenyl]-4,4'-diyl)bis-9H-carbazole (CDBP);
9,9'-[1,1'-biphenyl]-4,4'-diylbis-9H-carbazole (CBP);
9,9'-(1,3-phenylene)bis-9H-carbazole (mCP);
9-[4-(9H-carbazol-9-yl)phenyl]-N,N-diphenyl-9H-carbazol-3-amine;
9,9'-(1,4-phenylene)bis[N,N-diphenyl-9H-carbazol-3-amine;
9-[4-(9H-carbazol-9-yl)phenyl]-N,N,N',N'-tetraphenyl-9H-carbazole-3,6-diamine.

Another class of useful hole-transporting materials includes polycyclic aromatic compounds as described in EP 1 009 041. Some hole-injecting materials described in EP 0 891 121 A1 and EP 1 029 909 A1, can also make useful hole-transporting materials. In addition, polymeric hole-transporting materials can be used including poly(N-vinylcarbazole) (PVK), polythiophenes, polypyrrole, polyaniline, and copolymers including poly(3,4-ethylenedioxythiophene)/poly(4-styrenesulfonate) also called PEDOT/PSS.

Exciton Blocking Layer (EBL)

As described previously, an optional exciton- or electron-blocking layer may be present between the HTL and the LEL (layer 108 shown in the FIGURE). Some suitable examples of such blocking layers are described in U.S. Ser. No. 11/016,108 of Marina E. Kondavova et al., filed Dec. 17, 2004.

Light-Emitting Layer (LEL)

The light-emitting layer has been described previously. The device may have more than one light-emitting layer. Additional light-emitting layers may include phosphorescent materials or fluorescent materials. The term "fluorescent" refers to a material that emits light from a singlet-excited state.

Fluorescent materials may be used in the same layer as the phosphorescent material, in adjacent layers, in adjacent pixels, or any combination. Care must be taken to select materials that will not adversely affect the performance of the phosphorescent materials of this invention. One skilled in the art will understand that concentrations and triplet energies of materials in the same layer as the phosphorescent material or in an adjacent layer must be appropriately set so as to prevent unwanted quenching of the phosphorescence.

As more fully described in U.S. Pat. Nos. 4,769,292 and 5,935,721, the light-emitting layer (LEL) of the organic EL element includes a luminescent fluorescent or phosphorescent material where electroluminescence is produced as a result of electron-hole pair recombination in this region. The light-emitting layer can be comprised of a single material, but more commonly consists of a host material doped with a guest emitting material or materials where light emission comes primarily from the emitting materials and can be of any color. The host materials in the light-emitting layer can be an electron-transporting material, as defined below, a hole-transporting material, as defined above, or another material or combination of materials that support hole-electron recombination. The emitting material is usually chosen from highly fluorescent dyes and phosphorescent compounds, e.g., transition metal complexes as described in WO 98/55561, WO 00/18851, WO 00/57676, and WO 00/70655. Emitting materials are typically incorporated at 0.01 to 10% by weight of the host material.

The host and emitting materials can be small non-polymeric molecules or polymeric materials such as polyfluorenes and polyvinylarylenes (e.g., poly(p-phenylenevinylene), PPV). In the case of polymers, small molecule emitting materials can be molecularly dispersed into a polymeric host, or the emitting materials can be added by copolymerizing a minor constituent into a host polymer.

An important relationship for choosing an emitting material is a comparison of the bandgap potential which is defined as the energy difference between the highest occupied molecular orbital and the lowest unoccupied molecular orbital of the molecule. For efficient energy transfer from the host to the emitting material, a necessary condition is that the band gap of the dopant is smaller than that of the host material. For phosphorescent emitters it is also important that the host triplet energy level be high enough to enable energy transfer from host to emitting material.

Host and emitting materials known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

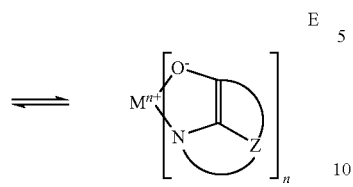

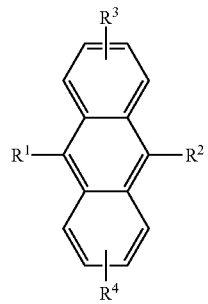

wherein

M represents a metal;

n is an integer of from 1 to 4; and

Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)]

CO-2: Magnesium bisoxine [alias, bis(8-quinolinolato)magnesium(II)]

CO-3: Bis[benzo {f}-8-quinolinolato]zinc (II)

CO-4: Bis(2-methyl-8-quinolinolato)aluminum(III)-μ-oxo-bis(2-methyl-8-quinolinolato) aluminum(III)

CO-5: Indium trisoxine [alias, tris(8-quinolinolato)indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato)zirconium(IV)]

Derivatives of anthracene (Formula F) constitute one class of useful host materials capable of supporting electroluminescence, and are particularly suitable for light emission of wavelengths longer than 400 nm, e.g., blue, green, yellow, orange or red. Asymmetric anthracene derivatives as disclosed in U.S. Pat. No. 6,465,115 and WO 2004/018587 are also useful hosts.

wherein: $R^1$ and $R^2$ represent independently selected aryl groups, such as naphthyl, phenyl, biphenyl, triphenyl, anthracene.

$R^3$ and $R^4$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl; or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

A useful class of anthracenes are derivatives of 9,10-di-(2-naphthyl)anthracene (Formula G).

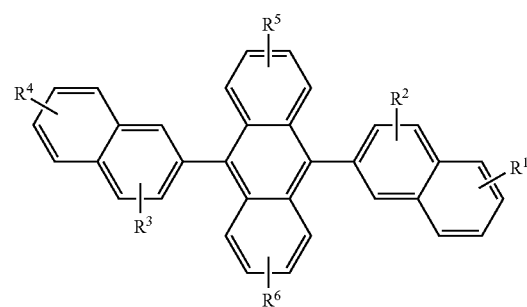

wherein: $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl; or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and
Group 6: fluorine, chlorine, bromine or cyano.
Illustrative examples of anthracene materials for use in a light-emitting layer include: 2-(4-methylphenyl)-9,10-di-(2-naphthyl)-anthracene; 9-(2-naphthyl)-10-(1,1'-biphenyl)-anthracene; 9,10-bis[4-(2,2-diphenylethenyl)phenyl]-anthracene;
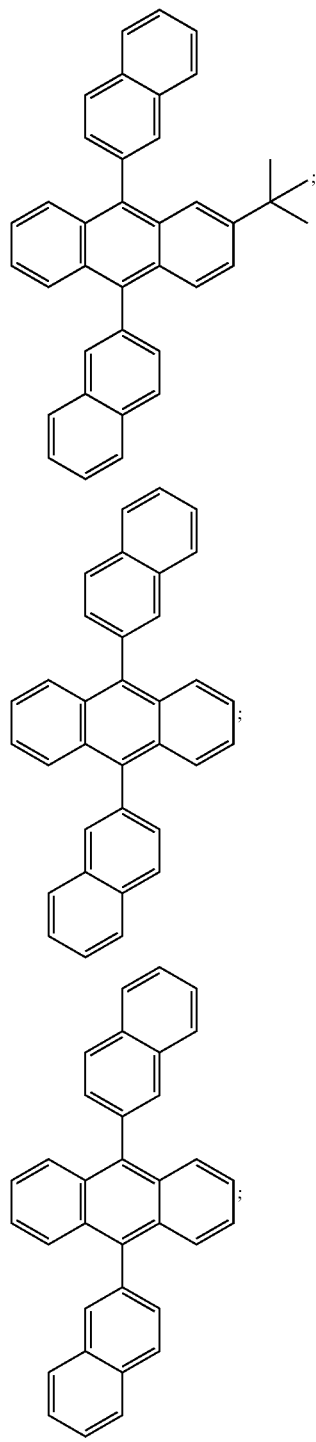
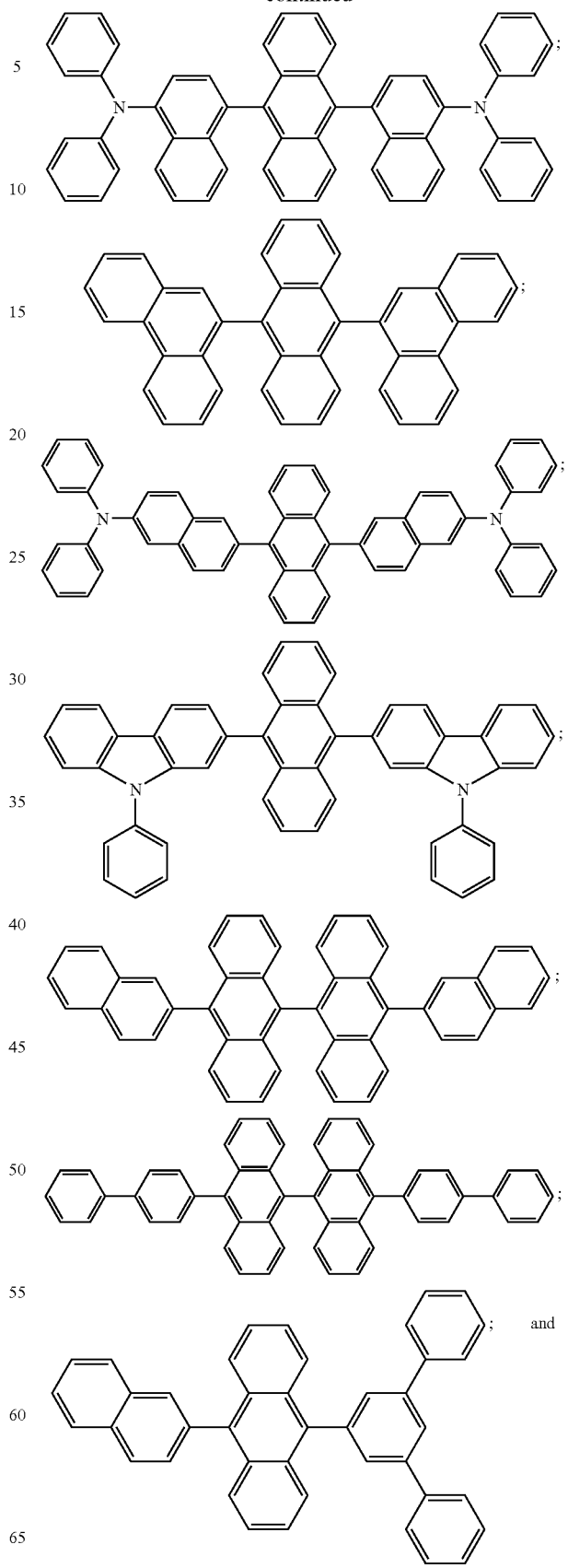

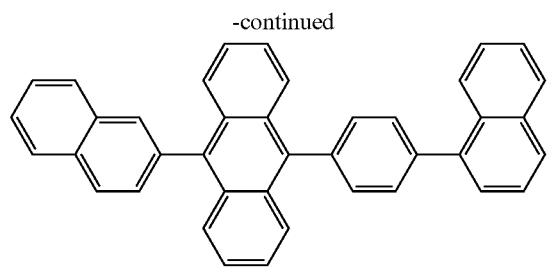

Distyrylarylene derivatives are also useful hosts, as described in U.S. Pat. No. 5,121,029. Carbazole derivatives are particularly useful hosts for phosphorescent emitters.

Useful fluorescent emitting materials include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds. Illustrative examples of useful materials include, but are not limited to, the following:

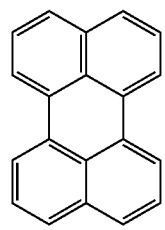

L1

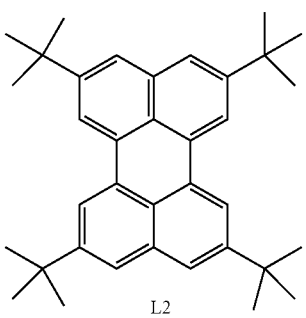

L2

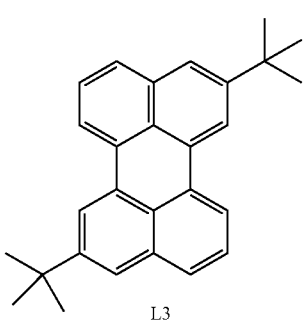

L3

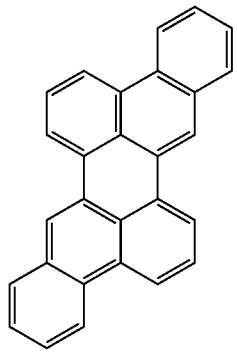

L4

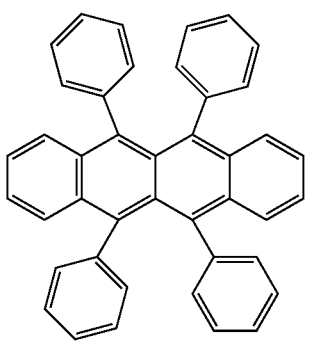

L5

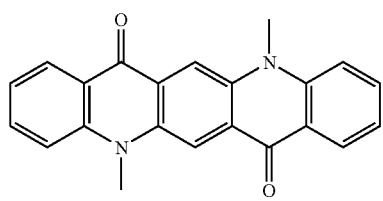

L6

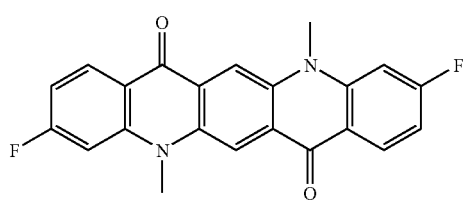

L7

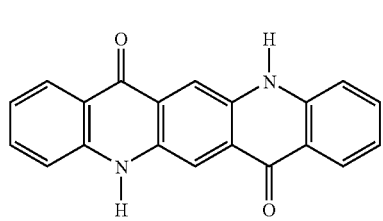

L8

-continued

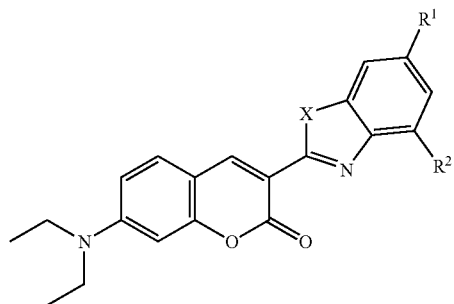

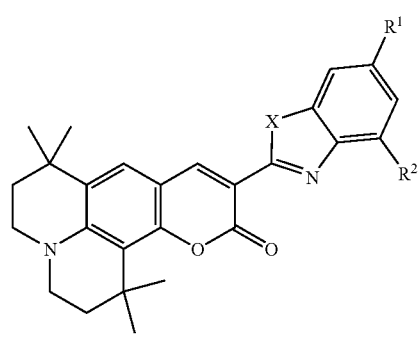

| | X | R1 | R2 |
|---|---|---|---|
| L0 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

-continued

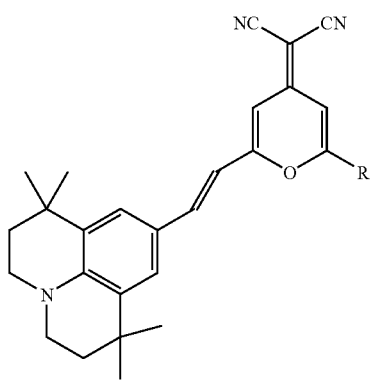

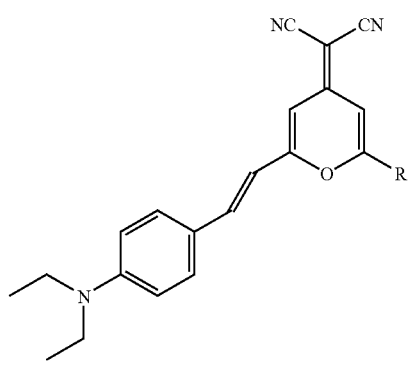

| | R |
|---|---|
| L37 | phenyl |
| L38 | methyl |
| L39 | t-butyl |
| L40 | mesityl |
| L41 | phenyl |
| L42 | methyl |
| L43 | t-butyl |
| L44 | mesityl |

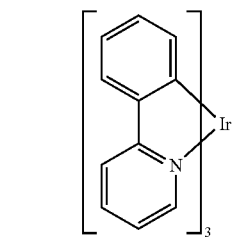

L45

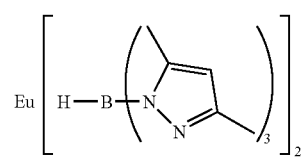

L46

-continued
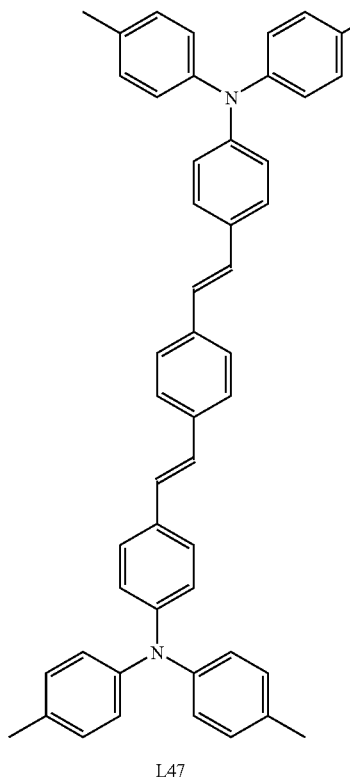
L47
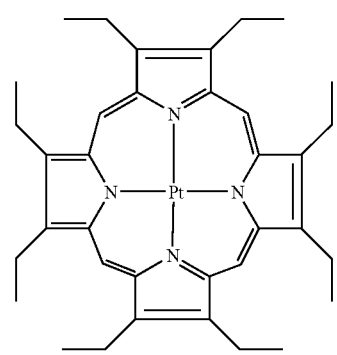
L48
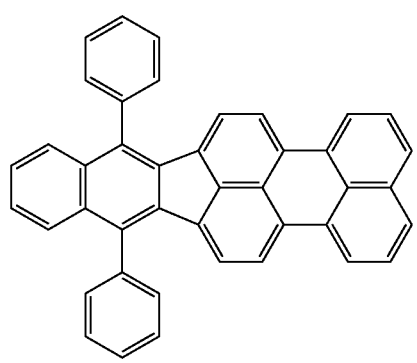
L49
-continued
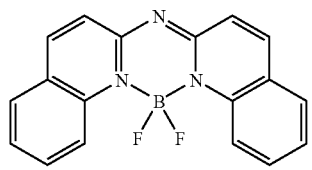
L50
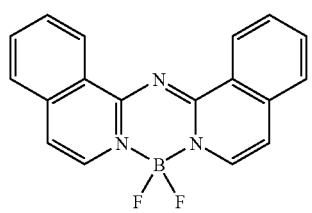
L51
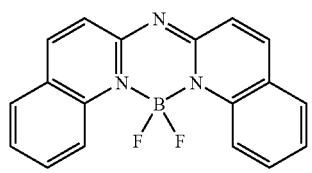
L52
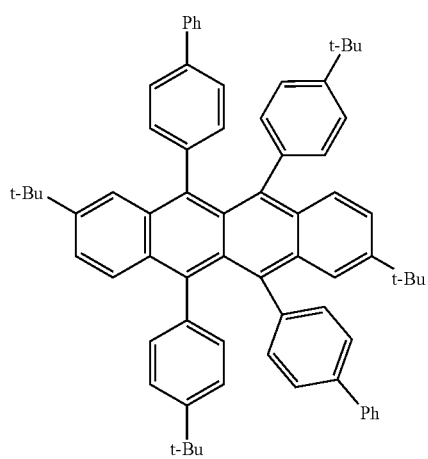
L53

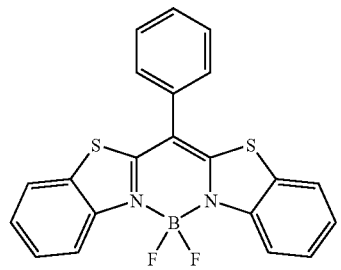

L54

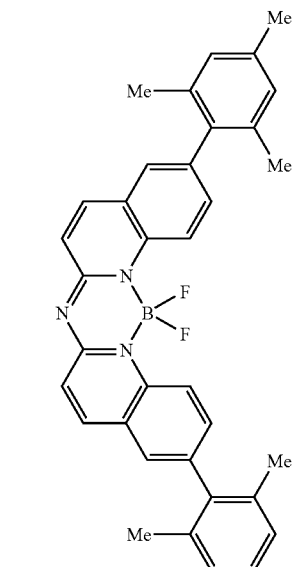

L55

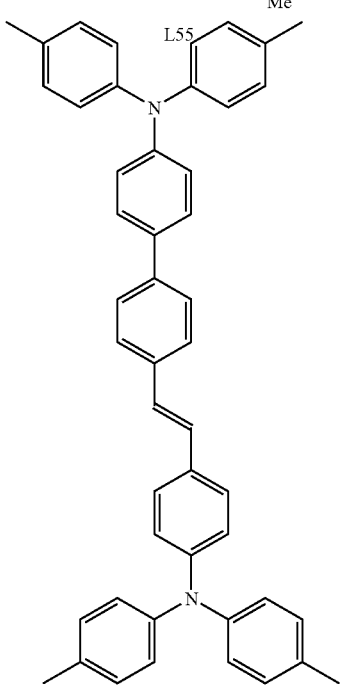

L56

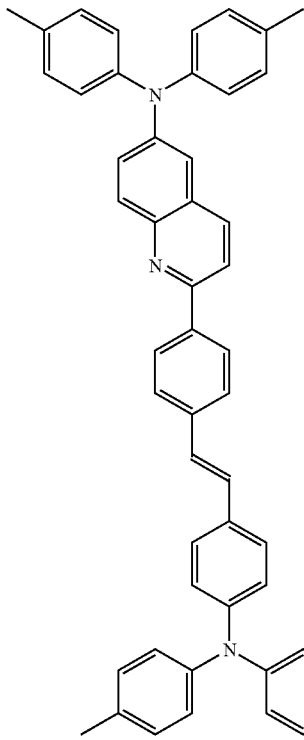

L57

Hole-Blocking Layer (HBL)

As described previously, in addition to suitable hosts and transporting materials, an OLED device according to the invention may also include at least one hole-blocking layer 110 placed between the electron-transporting layer 111 and the light-emitting layer 109 to help confine the excitons and recombination events to the light-emitting layer comprising co-hosts and a phosphorescent emitter. In this case, there should be an energy barrier for hole migration from co-hosts into the hole-blocking layer, while electrons should pass readily from the hole-blocking layer into the light-emitting layer comprising co-host materials and a phosphorescent emitter. The first requirement entails that the ionization potential of the hole-blocking layer 110 be larger than that of the light-emitting layer 109, desirably by 0.2 eV or more. The second requirement entails that the electron affinity of the hole-blocking layer 110 not greatly exceed that of the light-emitting layer 109, and desirably be either less than that of light-emitting layer or not exceed that of the light-emitting layer by more than about 0.2 eV. When used with an electron-transporting layer whose characteristic luminescence is green, such as an Alq-containing electron-transporting layer as described below, the requirements concerning the energies of the highest occupied molecular orbital (HOMO) and lowest unoccupied molecular orbital (LUMO) of the material of the hole-blocking layer frequently result in a characteristic luminescence of the hole-blocking layer at shorter wavelengths than that of the electron-transporting layer, such as blue, violet, or ultraviolet luminescence. Thus, it is desirable that the characteristic luminescence of the material of a hole-blocking layer be blue, violet, or ultraviolet. It is further desirable that the triplet energy of the hole-blocking material be greater than that of the phosphorescent material. Suitable hole-blocking materials are described in WO 00/70655A2, WO 01/41512 and WO 01/93642 A1. Two examples of useful hole-blocking materials are bathocuproine (BCP) and bis(2-methyl-8-quinolinolato)(4-phenylphenolato)aluminum(III) (BAlq). The characteristic luminescence of BCP is in the ultraviolet, and that of BAlq is blue. Metal complexes other than BAlq are also known to block holes and excitons as described in US 20030068528. When a hole-blocking layer is used, its thickness can be between 2 and 100 nm and suitably between 5 and 10 nm.

Electron-Transporting Layer (ETL)

The electron transporting material deposited in said electron transporting layer between the cathode and the light emitting layer may be the same or different from an electron transporting co-host material. The electron transporting layer may include more than one electron transporting compound, deposited as a blend or divided into separate layers.

Preferred thin film-forming materials for use in constructing the electron transporting layer of the organic EL devices of this invention are metal-chelated oxinoid compounds, including chelates of oxine itself (also commonly referred to as 8-quinolinol or 8-hydroxyquinoline). Such compounds help to inject and transport electrons, exhibiting high levels of performance, and are readily fabricated in the form of thin films. Exemplary of contemplated oxinoid compounds are those satisfying structural formula (ET1) below:

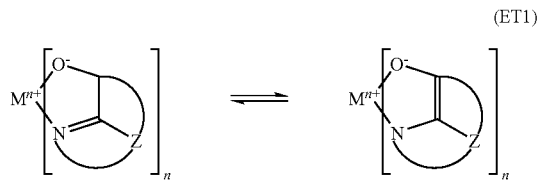

(ET1)

wherein:
　M represents a metal;
　n is an integer of from 1 to 4; and
　Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of usefull chelated oxinoid compounds are the following:
　CO-1: Aluminum trisoxine [alias, tris(8-quinolinolato) aluminum(III)];
　CO-2: Magnesium bisoxine [alias, bis(8-quinolinolato) magnesium(II)];
　CO-3: Bis[benzo {f}-8-quinolinolato]zinc (II);
　CO-4: Bis(2-methyl-8-quinolinolato)aluminum(III)-μ-oxo-bis(2-methyl-8-quinolinolato) aluminum(III);
　CO-5: Indium trisoxine [alias, tris(8-quinolinolato)indium];
　CO-6: Aluminum tris(5-methyloxine) [alias, tris(5-methyl-8-quinolinolato) aluminum(III)];
　CO-7: Lithium oxine [alias, (8-quinolinolato)lithium(I)];
　CO-8: Gallium oxine [alias, tris(8-quinolinolato)gallium (III)];
　CO-9: Zirconium oxine [alias, tetra(8-quinolinolato)zirconium(IV)].

Other electron transporting materials suitable for use in the electron transporting layer include various butadiene derivatives as disclosed in U.S. Pat. No. 4,356,429 and various heterocyclic optical brighteners as described in U.S. Pat. No. 4,539,507. Benzazoles satisfying structural formula (ET2) are also useful electron transporting materials:

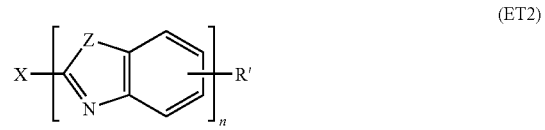

(ET2)

wherein:
　n is an integer of 3 to 8;
　Z is O, NR or S; and
　R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and
　X is a linkage unit consisting of carbon, alkyl, aryl, substituted alkyl, or substituted aryl, which conjugately or unconjugately connects the multiple benzazoles together. An example of a useful benzazole is 2, 2', 2''-(1,3,5-phenylene) tris[1-phenyl-1H-benzimidazole](TPBI) disclosed in Shi et al. in U.S. Pat. No. 5,766,779.

Other electron transporting materials suitable for use in the electron transporting layer may be selected from triazines, triazoles, imidazoles, oxazoles, thiazoles and their derivatives, polybenzobisazoles, pyridine- and quinoline-based materials, cyano-containing polymers, and arylketones, and perfluorinated materials.

The electron transporting layer or a portion of the electron transporting layer adjacent the cathode may further be doped with an alkali metal to reduce electron injection barriers and hence lower the drive voltage of the device. Suitable alkali metals for this purpose include lithium and cesium.

In one embodiment, the electron-transporting layer includes a mixture of materials such as those described by W. Begley et al. in U.S. Ser. No. 11/076,821 filed Mar. 10, 2005; U.S. Ser. No. 11/077,218 filed Mar. 10, 2005; and U.S. Ser. No. 11/116,096 filed Apr. 27, 2005, the disclosures of which are incorporated herein by reference.

Electron-Injecting Layer (EIL)

Electron-injecting layers, when present, include those described in U.S. Pat. Nos. 5,608,287; 5,776,622; 5,776,623; 6,137,223; and 6,140,763, the disclosures of which are incorporated herein by reference. An electron-injecting layer generally consists of a material having a work function less than 4.0 eV. A thin-film containing low work-function alkaline metals or alkaline earth metals, such as Li, Cs, Ca, Mg can be employed. In addition, an organic material doped with these low work-function metals can also be used effectively as the electron-injecting layer. Examples are Li-or Cs-doped Alq. In one suitable embodiment the electron-injecting layer includes LiF. In practice, the electron-injecting layer is often a thin layer deposited to a suitable thickness in a range of 0.1-3.0 nm.

Cathode

When light emission is viewed solely through the anode 103, the cathode used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One useful cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with an organic layer (e.g., an electron transporting layer (ETL)) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. An ETL material doped with an alkali metal, for example, Li-doped Alq, as disclosed in U.S. Pat. No. 6,013,384, is another example of a useful EIL. Other useful cathode material sets include, but are not limited to, those disclosed in U.S. Pat. Nos. 5,059,861, 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211, U.S. Pat. No. 5,247,190, JP 3,234,963, U.S. Pat. No. 5,703,436, U.S. Pat. No. 5,608,287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, U.S. Pat. No. 6,278,236, and U.S. Pat. No. 6,284,393. Cathode materials are typically deposited by any suitable methods such as evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Other Common Organic Layers and Device Architecture

In some instances, layers 109 and 111 can optionally be collapsed into a single layer that serves the function of supporting both light emission and electron transportation. It also known in the art that emitting dopants may be added to the hole-transporting layer, which may serve as a host. Multiple dopants may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, EP 1 182 244, U.S. Pat. No. U.S. Pat. No. 5,683,823, U.S. Pat. No. 5,503,910, U.S. Pat. No. 5,405,709, and U.S. Pat. No. 5,283,182, US 20020186214, US 20020025419, US 20040009367, and U.S. Pat. No. 6,627,333.

Additional layers such as exciton, electron and hole-blocking layers as taught in the art may be employed in devices of this invention. Hole-blocking layers are commonly used to improve efficiency of phosphorescent emitter devices, for example, as in US 20020015859, WO 00/70655A2, WO 01/93642A1, US 20030068528 and US 20030175553 A1.

This invention may be used in so-called stacked device architecture, for example, as taught in U.S. Pat. No. 5,703,436 and U.S. Pat. No. 6,337,492.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimation "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimation boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357) and inkjet method (U.S. Pat. No. 6,066,357).

One preferred method for depositing the materials of the present invention is described in US 2004/0255857 and U.S. Ser. No. 10/945,941 (now U.S. Pat. No. 7,288,286) where different source evaporators are used to evaporate each of the materials of the present invention. A second preferred method involves the use of flash evaporation where materials are metered along a material feed path in which the material feed path is temperature controlled. Such a preferred method is described in the following co-assigned patent applications: U.S. Ser. No. 10/784,585 (now U.S. Pat. No. 7,232,588); U.S. Ser. No. 10/805,980 (now U.S. Pat. No. 7,238,389); U.S. Ser. No. 10/945,940 (now U.S. Pat. No. 7,288,285); U.S. Ser. No. 10/945,941 (now U.S. Pat. No. 7,288,286); U.S. Ser. No. 11/050,924 (now U.S. Patent Application Publication No. 2006/0177576); and U.S. Ser. No. 11/050,934 (now U.S. Pat. No. 7,165,340). Using this second method, each material may be evaporated using different source evaporators or the solid materials may be mixed prior to evaporation using the same source evaporator.

Encapsulation

Most OLED devices are sensitive to moisture or oxygen, or both, so they are commonly sealed in an inert atmosphere such as nitrogen or argon. In sealing an OLED device in an inert environment, a protective cover can be attached using an organic adhesive, a metal solder, or a low melting temperature glass. Commonly, a getter or desiccant is also provided within the sealed space. Useful getters and desiccants include, alkali and alkaline metals, alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters in functional relationship with the light emitting areas of the display. Filters, polarizers, and anti-glare or anti-reflection coatings can also be provided over a cover or as part of a cover.

The OLED device may have a microcavity structure. In one useful example, one of the metallic electrodes is essentially opaque and reflective; the other one is reflective and semitransparent. The reflective electrode is preferably selected from Au, Ag, Mg, Ca, or alloys thereof. Because of the presence of the two reflecting metal electrodes, the device has a microcavity structure. The strong optical interference in this structure results in a resonance condition. Emission near the resonance wavelength is enhanced and emission away from the resonance wavelength is depressed. The optical path length can be tuned by selecting the thickness of the organic layers or by placing a transparent optical spacer between the electrodes. For example, an OLED device of this invention can have ITO spacer layer placed between a reflective anode and the organic EL media, with a semitransparent cathode over the organic EL media.

The entire contents of the patents and other publications referred to in this specification are incorporated herein by reference.

Embodiments of the invention may provide advantageous features such as higher luminous yield, lower drive voltage, and higher power efficiency, longer operating lifetimes or ease of manufacture. Embodiments of devices useful in the invention can provide a wide range of hues including those useful in the emission of white light (directly or through filters to provide multicolor displays). Embodiments of the invention can also provide an area lighting device.

The invention and its advantages are further illustrated by the specific examples that follow. Unless otherwise specified, the term "percentage" or "percent" and the symbol "%" of a material indicate the volume percent of the material in the layer in which it is present.

EXAMPLE 1

Synthesis of Inv-1.

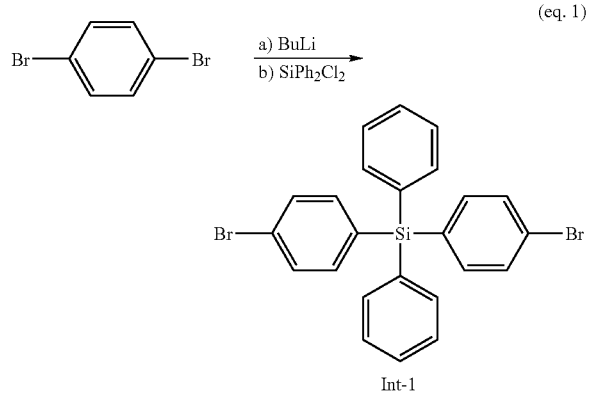

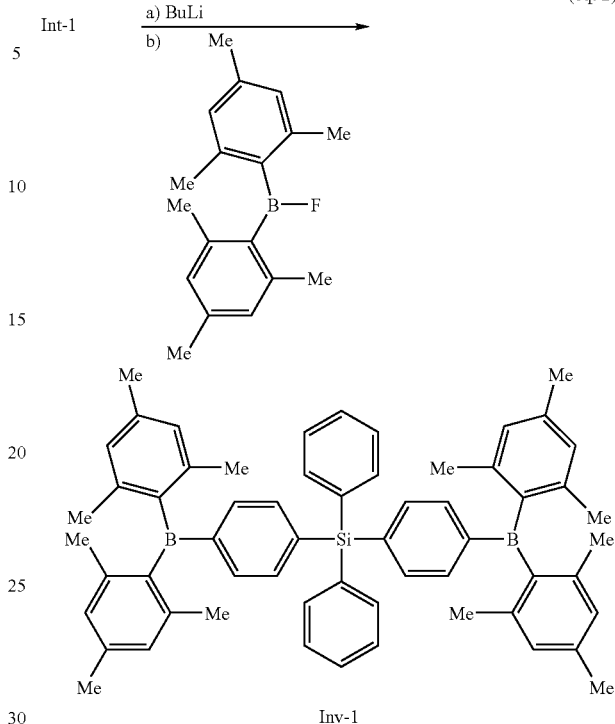

Inv-1 was prepared by the following procedure (eq. 1 and eq. 2). A solution of 1,4-dibromobenzene (2.359 g, 10 mmol) in ether (55 ml) was stirred at −40° C. under dry $N_2$ and treated with a solution of butyllithium (2.5 M in hexane, 10 mmol). The resulting mixture was kept at −10° C. for 15 min, and then $SiPh_2Cl_2$ (0.93 ml, 4.5 mmol) was added quickly. The mixture was stirred at −10° C. for 30 min and at room temperature overnight. Then water was added, and the mixture was extracted with a combination of ether and dichloromethane. The combined extracts were washed with water, dried over $MgSO_4$, and filtered. Volatiles were removed by evaporation under reduced pressure, and the residue was purified by column chromatography on silica gel with 7% toluene/hexane. This afforded bis(4-bromophenyl)diphenylsilane (Int-1) in 75% yield.

Bis(4-bromophenyl)diphenylsilane (3.2 g, 6.5 mmol) was dissolved in 40 ml dry THF. The solution was cooled to −78° C., and treated with a solution of butyllithium (1.6 M in hexane, 13.65 mmol). After stirring at −78° C. for 1 hour, a solution of dimesitylboron fluoride (3.84 g, 14.3 mmol) in 50 ml ether was added dropwise. The mixture was stirred overnight while the temperature was allowed to rise slowly to 25° C. Volatiles were removed by evaporation under reduced pressure, and the residue was dissolved in dichloromethane, washed with water and brine, dried over $MgSO_4$, and filtered. Dichloromethane was removed, and the residue was purified by column chromatography on silica gel with 10% dichloromethane/hexane to afford bis(4-dimesitylboronphenyl) diphenylsilane, Inv-1, in 71% yield. The triplet energy of Inv-1 was calculated to be 2.93 eV.

EXAMPLE 2

Synthesis of Inv-10.

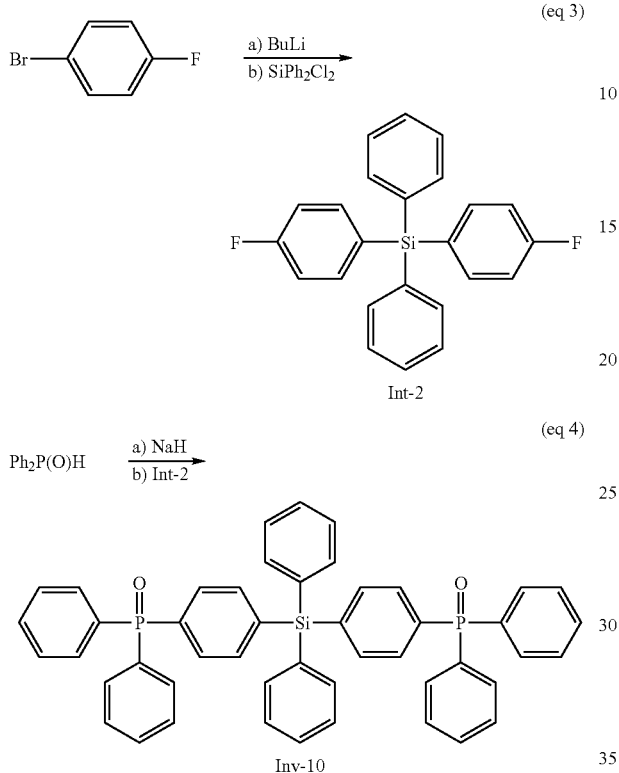

Inv-10 was prepared by the following procedure (eq. 3 and eq. 4). A solution of 4-fluorobromobenzene (4.2 g, 24 mmol) in ether (55 ml) was stirred at −40° C. under dry $N_2$ and treated with a solution of butyllithium (1.6 M in hexane, 20 mmol). The resulting mixture was kept at −40° C. for 30 min, and then $SiPh_2Cl_2$ (1.85 ml, 9 mmol) was added quickly. The mixture was stirred at −40° C. for 30 min and then at room temperature overnight. Volatiles were removed by evaporation under reduced pressure, and the residue was recrystallized from ether/methanol twice to give bis(4-difluorophenyl)diphenylsilane (Int-2) as colorless crystals; yield: 62%.

Sodium hydride (0.44 g, 11 mmol, in the form of a 60 wt % suspension in mineral oil) was added to a stirred solution of diphenylphosphineoxide (2.22 g, 11 mmol) in dry N,N'-dimethylformamide (40 ml) at room temperature under nitrogen. With evolution of hydrogen a yellow solution was formed. Then, bis(4-difluorophenyl)diphenylsilane (1.84 g, 5 mmol) was added and the mixture was warmed to 140° C. After stirring for 12 hours the product mixture was cooled and acidified with dilute hydrochloride acid. The product was extracted with chloroform, washed with sodium hydrogen carbonate and dried over magnesium sulfate. On evaporation of all chloroform the residue was purified by column chromatography on silica gel with 5% methanol/dichloromethane to afford bis(4-diphenylphosphoineoxidephenyl)diphenylsilane, Inv-10, in 43% yield. The triplet energy of Inv-10 was calculated to be 2.91 eV.

EXAMPLE 3

Fabrication of EL Devices 1-1, 1-2, and 1-3.

EL device 1 -1, satisfying the requirements of the invention, was constructed in the following manner.

A glass substrate coated with an 21.5 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon ($CF_x$) hole-injecting layer (HIL) by plasma-assisted deposition of $CHF_3$.

b) A hole-transporting layer (HTL-1) of N,N'-di-1-naphthalenyl-N,N'-diphenyl-4,4'-diaminobiphenyl (NPB) having a thickness of 75 nm was then evaporated onto a).

c) An exciton-blocking layer (EBL) of 4,4',4"-tris(N-carbazolyl) triphenylamine (TCTA) having a thickness of 10 nm was then deposited.

d) A 35 nm light-emitting layer (LEL) including a primary host, Inv-1; and 8% by volume of a phosphorescent light emitting material, D-1, was then deposited onto the exciton-blocking layer.

e) A 10 nm hole-blocking layer of Inv-1 was then deposited on the light-emitting layer.

f) A 20 nm electron-transporting layer (ETL) of tris(8-quinolinolato)aluminum (III)(Alq) was then deposited onto the light-emitting layer.

g) On top of the ETL was deposited was deposited a 20 nm layer of Mg and Ag in the ratio of 10:1 to form the cathode.

The above sequence completed the deposition of the EL device. The device was then hermetically packaged in a dry glove box for protection.

Device 1-2 was prepared in exactly the same manner as Device 1-1, except Inv-1 was replaced with Inv-10 in both the LEL and the HBL. Comparative device 1-3 was also prepared in the same manner as Device 1 -1, except Inv-1 was replaced with C-1 in both the LEL and the HBL.

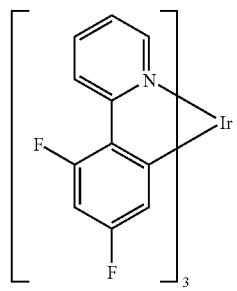

D-1

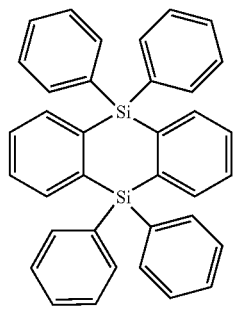

C-1

The devices thus formed were tested for efficiency and color at an operating current of 1.0 mA/cm² and the results are listed in Table 1. Radiant yield is the radiant flux (in watts) produced by the device per amp of input current, where radiant flux is the light energy produced by the device per unit time. The color of light produced by the device is reported in CIEx, CIEy (Commission International de L'Eclairage) coordinates.

TABLE 1

Testing results for Device 1-1, 1-2, and 1-3.

| Device | Example | Voltage (V) | Luminous Yield (Cd/A) | Radiant Yield (W/A) | CIEx, y |
|---|---|---|---|---|---|
| 1-1 | Invention | 9.8 | 7.44 | 0.084 | 0.16, 0.35 |
| 1-2 | Invention | 6.1 | 6.25 | 0.084 | 0.15, 0.29 |
| 1-3 | Comparison | 11.7 | 6.8 | 0.08 | 0.15, 0.31 |

It be seen from Table 1 that the inventive compounds, when used as a host for the blue phosphorescent dopant D-1, gave devices that have excellent luminance. They also afford ed much lower voltage than the comparison host C-1, which does not have electron withdrawing substituents.

The invention has been described in detail with particular reference to certain preferred embodiments thereof, but it will be understood that variations and modifications can be effected within the spirit and scope of the invention. For example, multiple first compounds and multiple second compounds can be used in said further layer of the invention as long as they have the correct LUMO values. In addition, the invention can be used in devices emitting any colored light and said layer can be adjacent to other layers on either side, between the cathode and the LEL.

The patents and other publications referred to are incorporated herein in their entirety.

PARTS LIST

101 Substrate
103 Anode
105 Hole-Injecting layer (HIL)
107 First Hole-Transporting layer (HTL)
108 Exciton-Blocking layer (EBL)
109 Light-Emitting layer (LEL)
110 Hole-Blocking Layer (HBL)
111 Electron-Transporting layer (ETL)
113 Cathode
150 Voltage/Current Source
160 Electrical Connectors

The invention claimed is:

1. An OLED device comprising a cathode and an anode and having located therebetween a light-emitting layer comprising a phosphorescent light-emitting material and a host comprising a compound of Formula (3a):

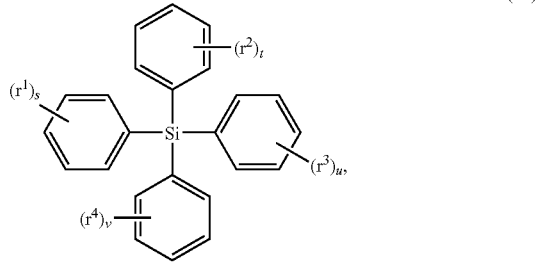

(3a)

wherein:
  s, t, u, and v are independently 0-5, provided that s, t, u, and v are not all 0; and
  each $r^1$ through $r^4$ represents an independently selected substituent, provided at least one $r^1$ through $r^4$ comprises a substituent of Formula (3b):

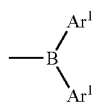

(3b)

wherein:
  each $Ar^1$ may be the same or different and each represents an independently selected aromatic group.

2. An OLED device of claim 1 wherein s, t and u are 0 and v is 1.

3. An OLED device of claim 1 wherein the compound of Formula (3a) is:

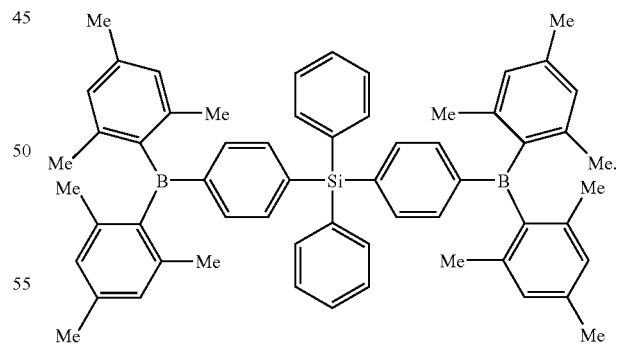

4. The device of claim 1 wherein a compound of Formula (3a) is present in a layer adjacent to the light-emitting layer on the cathode side.

5. An OLED device comprising a cathode and an anode and having located therebetween a light-emitting layer comprising a phosphorescent light-emitting material and a host comprising a compound of Formula (3c):

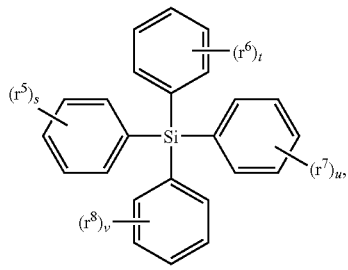
(3c)

wherein:
s, t, u, and v are independently 0-5, provided that s, t, u, and v are not all 0; and
each $r^5$ through $r^8$ represents an independently selected substituent, provided at least one $r^1$ through $r^4$ comprises a substituent of Formula (3d):

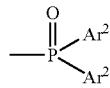
(3d)

wherein:
each $A^2$ may be the same of different and each represents an independently selected aromatic group.

6. An OLED device of claim 5 wherein s, t and u are 0 and v is 1.

7. An OLED device of claim 5 wherein the compound of Formula (3c) is:

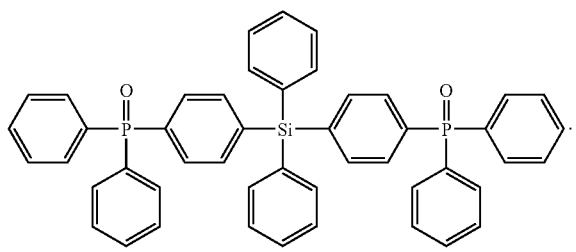

8. The device of claim 5 wherein a compound of Formula (3c) is present in a layer adjacent to the light-emitting layer on the cathode side.

* * * * *

UNITED STATES PATENT AND TRADEMARK OFFICE
CERTIFICATE OF CORRECTION

PATENT NO. : 7,588,839 B2 Page 1 of 1
APPLICATION NO. : 11/254108
DATED : September 15, 2009
INVENTOR(S) : Xiaofan Ren et al.

It is certified that error appears in the above-identified patent and that said Letters Patent is hereby corrected as shown below:

Title Page, Column 2, Item [56] Delete "Nov. 1," and insert --No. 18, Nov. 3,--, therefor.
(Other Publications)
Column 60, line 2 In Claim 5, delete "$A^2$" and insert --$Ar^2$--, therefor.

Signed and Sealed this

Nineteenth Day of January, 2010

David J. Kappos
*Director of the United States Patent and Trademark Office*